United States Patent
Mei et al.

(10) Patent No.: US 12,127,464 B2
(45) Date of Patent: Oct. 22, 2024

(54) PREPARATION METHODS OF QUANTUM DOT LIGHT EMITTING DEVICE AND QUANTUM DOT DISPLAY PANEL USING STACKED SACRIFICIAL LAYER AND PHOTORESIST LAYER

(71) Applicant: BOE Technology Group Co., Ltd., Beijing (CN)

(72) Inventors: Wenhai Mei, Beijing (CN); Zhenqi Zhang, Beijing (CN); Aidi Zhang, Beijing (CN); Xiaoyuan Zhang, Beijing (CN); Haowei Wang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 470 days.

(21) Appl. No.: 17/429,523

(22) PCT Filed: Mar. 18, 2020

(86) PCT No.: PCT/CN2020/079996
§ 371 (c)(1),
(2) Date: Aug. 9, 2021

(87) PCT Pub. No.: WO2021/184256
PCT Pub. Date: Sep. 23, 2021

(65) Prior Publication Data
US 2022/0310983 A1 Sep. 29, 2022

(51) Int. Cl.
*H10K 71/00* (2023.01)
*H10K 50/125* (2023.01)
*H10K 50/115* (2023.01)

(52) U.S. Cl.
CPC ........... *H10K 71/00* (2023.02); *H10K 50/125* (2023.02); *H10K 50/115* (2023.02)

(58) Field of Classification Search
CPC .............................. H10K 71/00; H10K 50/115
See application file for complete search history.

(56) References Cited

U.S. PATENT DOCUMENTS

| 10,186,689 B2 | 1/2019 | Li et al. | |
|---|---|---|---|
| 2009/0087792 A1* | 4/2009 | Iizumi | H05B 33/10 |
| | | | 430/312 |

(Continued)

FOREIGN PATENT DOCUMENTS

| CN | 102169959 A | 8/2011 |
|---|---|---|
| CN | 102709487 A | 10/2012 |

(Continued)

OTHER PUBLICATIONS

Nov. 25, 2022—(EP)—Extended European Search Report Appn 20925450.7.

(Continued)

*Primary Examiner* — Jay C Chang
*Assistant Examiner* — Mikka Liu
(74) *Attorney, Agent, or Firm* — Banner & Witcoff, Ltd.

(57) ABSTRACT

Embodiments of the present disclosure provide a quantum dot light emitting device, a preparation method thereof and a quantum dot display panel, the method includes: forming a first function layer; forming a first sacrificial layer and a first photoresist layer; patterning the first photoresist layer; patterning the first sacrificial layer, the first function layer includes a first part and a second part, and the first sacrificial layer pattern and the first photoresist pattern are stacked on the first part, the second part is exposed by the first sacrificial layer pattern and the first photoresist pattern; forming a first quantum dot material layer; stripping the first sacrificial layer pattern to remove the first sacrificial layer pattern, the first photoresist pattern and the first quantum dot material layer on the first sacrificial layer pattern, retaining the first (Continued)

quantum dot material layer on the second part of the first function layer.

19 Claims, 8 Drawing Sheets

(56) References Cited

U.S. PATENT DOCUMENTS

| | | |
|---|---|---|
| 2011/0171584 A1 | 7/2011 | Suh et al. |
| 2017/0256754 A1* | 9/2017 | Defranco ............. H10K 59/353 |
| 2021/0095194 A1 | 4/2021 | Mei |

FOREIGN PATENT DOCUMENTS

| | | |
|---|---|---|
| CN | 107732031 A | 2/2018 |
| CN | 109935725 A | 6/2019 |
| CN | 110628417 A | 12/2019 |
| JP | 2005183782 A | 7/2005 |
| JP | 2009087760 A | 4/2009 |
| KR | 10-2018-0083888 A | 7/2018 |
| WO | 2020020220 A1 | 1/2020 |

OTHER PUBLICATIONS

May 3, 2024—(KR)—Korean Office Action Appn 10-2022-7018975, English translation.
May 3, 2024—(KR)—Korean Office Action Appn 10-2022-7018975.

* cited by examiner

PREPARATION METHODS OF QUANTUM DOT LIGHT EMITTING DEVICE AND QUANTUM DOT DISPLAY PANEL USING STACKED SACRIFICIAL LAYER AND PHOTORESIST LAYER

The application is a U.S. National Phase Entry of International Application No. PCT/CN2020/079996 filed on Mar. 18, 2020, designating the United States of America. The present application claims priority to and the benefit of the above-identified application and the above-identified application is incorporated by reference herein in its entirety.

TECHNICAL FIELD

At least one embodiment of the present disclosure relates to a quantum dot light emitting device, a preparation method thereof and a preparation method of a quantum dot display panel.

BACKGROUND

A quantum dot (QD) is a nanocrystalline particle with a radius smaller than or close to the Bohr exciton radius, and a size of the quantum dot is generally in a range of 1 nm to 20 nm. The quantum dot has a quantum confinement effect and can emit fluorescence after being excited. The quantum dot has some unique characteristics, such as tunable emission wavelength, narrow emission spectrum, wide excitation peak and high emission stability, which have become a focus of research and development. A quantum dot light emitting display panel has advantages of high luminous efficiency, wide color range, realistic color reproduction and low energy consumption, and so on.

A quantum dot light emitting display panel (QLED) includes a light emitting layer made of a quantum dot material. The quantum dot material is sandwiched between an electron transport layer and a hole transport layer. The light emitting layer is introduced between a different electron transport layer and a different hole transport layer, so as to obtain light with a required wavelength. An electric field is applied to the quantum dot light emitting display panel to move electrons and holes into the light emitting layer. In the light emitting layer, electrons and holes are trapped in quantum dots and recombine to emit photons. Compared with an organic light emitting diode display panel, an emission spectrum of the quantum dot light emitting display panel is narrower.

SUMMARY

At least one embodiment of the present disclosure provides a preparation method of a quantum dot light emitting device, and the preparation method comprises: providing a base substrate; forming a first electrode on the base substrate; forming a first function layer on the first electrode; sequentially forming a first sacrificial layer and a first photoresist layer on the first function layer; patterning the first photoresist layer to form a first photoresist pattern; patterning the first sacrificial layer with the first photoresist pattern as a mask to form a first sacrificial layer pattern, in which the first function layer comprises a first part and a second part, the first sacrificial layer pattern and the first photoresist pattern are sequentially stacked on the first part, and the second part is exposed by the first sacrificial layer pattern and the first photoresist pattern; forming a first quantum dot material layer on the first photoresist pattern and the second part of the first function layer; stripping the first sacrificial layer pattern to remove the first sacrificial layer pattern, and the first photoresist pattern and the first quantum dot material layer that are on the first sacrificial layer pattern, and retaining the first quantum dot material layer on the second part of the first function layer to form a first quantum dot light emitting layer; and forming a second electrode on the first quantum dot light emitting layer.

For example, in the preparation method provided by at least one embodiment of the present disclosure, a material of the first sacrificial layer comprises an alcohol-soluble material, and the alcohol-soluble material comprises a polymer material with a relative molecular mass greater than or equal to 1000 or a small molecular material with a relative molecular mass less than 1000.

For example, in the preparation method provided by at least one embodiment of the present disclosure, the polymer material comprises at least one selected from a group consisting of polyethylene glycol, polyvinyl alcohol, polyvinylpyrrolidone, polyamide, acrylic polymer, polyfluorene containing a tertiary amine group, polyurethane, alkyd resin, phenolic resin, urea formaldehyde resin and polyvinyl butyral.

For example, in the preparation method provided by at least one embodiment of the present disclosure, the small molecular material comprises at least one selected from a group consisting of dibromo aminofluorene, dibromo dimethylamino propyl fluorene, bromocarbazole, dialdehyde carbazole, hydroxylcarbazole, amino naphthalimide, dihydroxy phenanthroline, dioctyl tetracarboxy diimide, isopropylphenyl perylene tetraformyl diimide, p-methylbenzoic acid, p-methoxybenzoic acid, p-mercaptobenzoic acid, fullerene benzoic acid and fullerene phosphoric acid.

For example, in the preparation method provided by at least one embodiment of the present disclosure, the patterning the first sacrificial layer comprises dry etching such as etching the first sacrificial layer by inductively coupled plasma or reactive ion etching.

For example, in the preparation method provided by at least one embodiment of the present disclosure, the first photoresist layer is a negative photoresist.

For example, in the preparation method provided by at least one embodiment of the present disclosure, the first sacrificial layer pattern is stripped by ultrasonic treatment to remove the first sacrificial layer pattern and the first photoresist pattern and the first quantum dot material layer that are on the first sacrificial layer pattern.

For example, in the preparation method provided by at least one embodiment of the present disclosure, the ultrasonic treatment is performed in an alcohol solvent.

For example, in the preparation method provided by at least one embodiment of the present disclosure, conditions of the ultrasonic treatment comprise an ultrasonic treatment in ethanol at a power in a range of 30 W to 350 W for 1 min to 8 min.

For example, in the preparation method provided by at least one embodiment of the present disclosure, before stripping the first sacrificial layer pattern, the method further comprises: performing a ligand exchange on a first quantum dot in the first quantum dot material layer.

For example, in the preparation method provided by at least one embodiment of the present disclosure, after performing the ligand exchange on the first quantum dot, a total number of an aromatic ring structure or a total number of a cyclic non-aromatic ring structure in the ligand on a surface of the first quantum dot is greater than or equal to 1, a total number of carbon atoms in a main chain of a coordination chain of the ligand except for the aromatic ring structure or the cyclic non-aromatic ring structure is greater than 2 and less than 4, and a coordination atom on the ligand comprises at least one selected from a group consisting of N, O, S and P.

For example, in the preparation method provided by at least one embodiment of the present disclosure, the aromatic ring structure comprises at least one selected from a group consisting of a benzene ring, a nitrogen-containing aromatic ring, a sulfur-containing aromatic ring and an oxygen-containing aromatic ring; the cyclic non-aromatic ring structure comprises at least one selected from a group consisting of an oxygen-containing heterocyclic ring, a nitrogen-containing heterocyclic ring and a sulfur-containing heterocyclic ring.

For example, in the preparation method provided by at least one embodiment of the present disclosure, the ligand used for the ligand exchange comprises at least one selected from a group consisting of p-methylbenzylamine and p-methylphenylethylamine.

For example, in the preparation method provided by at least one embodiment of the present disclosure, a first quantum dot material in the first quantum dot material layer comprises at least one selected from a group consisting of CdS, CdSe, ZnSe, InP, PbS, $CsPbCl_3$, $CsPbBr_3$, $CsPbI_3$, CdS/ZnS, CdSe/ZnS, ZnSe, InP/ZnS, PbS/ZnS, $CsPbCl_3$/ZnS, $CsPbBr_3$/ZnS and $CsPbI_3$/ZnS.

For example, in the preparation method provided by at least one embodiment of the present disclosure, forming the first quantum dot material layer comprises: forming the first quantum dot material: dissolving the first quantum dot material in a solvent to form a first quantum dot material solution, the solvent comprises a good solvent and a poor solvent of the first quantum dot material, and a volume ratio of the good solvent and the poor solvent is 20:1 to 1:20; and applying the first quantum dot material solution to the first photoresist pattern and the second part of the first functional layer.

For example, in the preparation method provided by at least one embodiment of the present disclosure, the solvent comprises at least one selected from a group consisting of the following combinations: a combination of n-hexane and acetone, a combination of n-hexane and n-butanol, a combination of n-hexane and isopropanol, a combination of toluene and acetone, a combination of toluene and n-butanol, and a combination of toluene and isopropanol.

For example, in the preparation method provided by at least one embodiment of the present disclosure, a method for forming the first function layer comprises a spin-coating method or a sol-gel method.

For example, in the preparation method provided by at least one embodiment of the present disclosure, the first function layer is an electron transport layer, and a material of the electron transport layer is zinc oxide.

For example, in the preparation method provided by at least one embodiment of the present disclosure, before forming the second electrode, the method further comprises forming a second function layer.

At least one embodiment of the present disclosure further provides a preparation method of a quantum dot display panel, and the preparation method comprises: forming a quantum dot light emitting device using any one of the preparation methods mentioned above.

For example, in the preparation method provided by at least one embodiment of the present disclosure, before forming the second electrode, the preparation method further comprises: sequentially forming a second sacrificial layer and a second photoresist layer on the first function layer and the first quantum dot light emitting layer; patterning the second photoresist layer to form a second photoresist pattern; patterning the second sacrificial layer with the second photoresist pattern as a mask to form a second sacrificial layer pattern, the first function layer comprises a third part and a fourth part, the second sacrificial layer pattern and the second photoresist pattern are sequentially stacked on the third part, and the fourth part is exposed by the second sacrificial layer pattern and the second photoresist pattern; forming a second quantum dot material layer on the second photoresist pattern and the fourth part of the first function layer; and stripping the second sacrificial layer pattern to remove the second sacrificial layer pattern, and the second photoresist pattern and the second quantum dot material layer that are on the second sacrificial layer pattern, and retaining the second quantum dot material layer on the fourth part of the first function layer to form a second quantum dot light emitting layer.

For example, the preparation method provided by at least one embodiment of the present disclosure, further comprises: sequentially forming a third sacrificial layer and a third photoresist layer on the first function layer, the first quantum dot light emitting layer and the second quantum dot light emitting layer; patterning the third photoresist layer to form a third photoresist pattern; patterning the third sacrificial layer with the third photoresist pattern as a mask to form a third sacrificial layer pattern, the first function layer comprises a fifth part and a sixth part, the third sacrificial layer pattern and the third photoresist pattern are sequentially stacked on the fifth part, and the sixth part is exposed by the third sacrificial layer pattern and the third photoresist pattern; forming a third quantum dot material layer on the third photoresist pattern and the sixth part of the first function layer; and stripping the third sacrificial layer pattern to remove the third sacrificial layer pattern, and the third photoresist pattern and the third quantum dot material layer that are on the third sacrificial layer pattern, and retaining the third quantum dot material layer on the sixth part of the first function layer to form a third quantum dot light emitting layer.

At least one embodiment of the present disclosure further provides a quantum dot light emitting device, and the quantum dot light emitting device comprises a quantum dot light emitting layer, and a quantum dot comprised in the quantum dot light emitting layer has a ligand constituted by at least one selected from a group consisting of p-methylbenzylamine and p-methylphenylethylamine.

BRIEF DESCRIPTION OF THE DRAWINGS

In order to clearly illustrate the technical solution of the embodiments of the present disclosure, the drawings of the embodiments will be briefly described in the following, it is obvious that the described drawings are only related to some embodiments of the present disclosure and thus are not limitative of the present disclosure.

DETAILED DESCRIPTION

Figure 1:
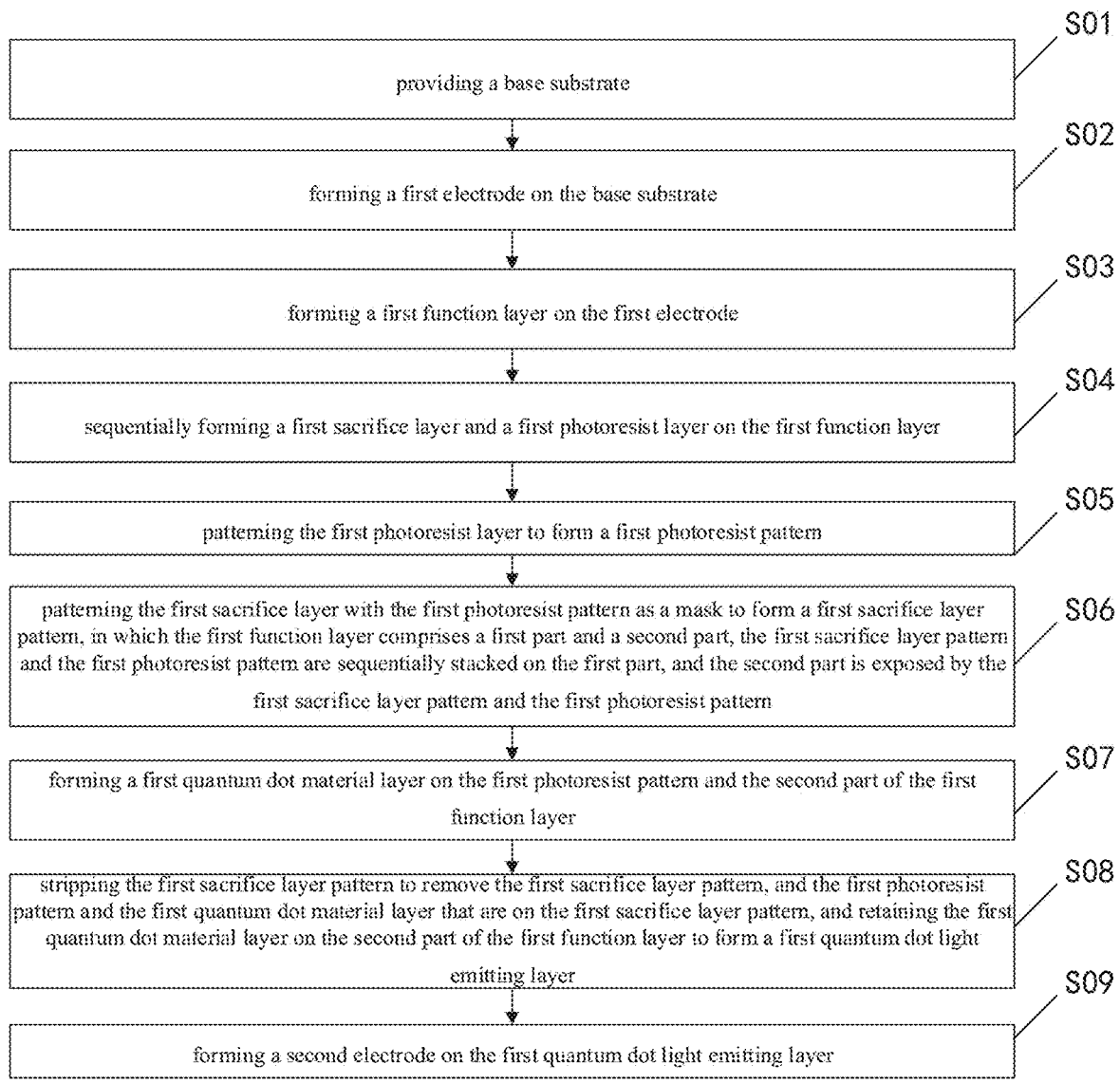
FIG. 1 is a flow chart of a preparation method of a quantum dot light emitting device provided by an embodiment of the present disclosure.

In order to make objects, technical details and advantages of the embodiments of the present disclosure apparent, the technical solutions of the embodiments will be described in a clearly and fully understandable way in connection with the drawings related to the embodiments of the present disclosure. Apparently, the described embodiments are just a part but not all of the embodiments of the present disclosure. Based on the described embodiments herein, those skilled in the art can obtain other embodiment (s), without any inventive work, which should be within the scope of the present disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present disclosure, are not intended to indicate any sequence, amount or importance, but distinguish various components. Also, the terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "left," "right" and the like are only used to indicate relative position relationship, and when the position of the object which is described is changed, the relative position relationship may be changed accordingly.

A quantum dot light emitting layer in a quantum dot light emitting display device is usually prepared by a printing method, but in a case that the quantum dot light emitting layer in the quantum dot light emitting display device is prepared by the printing method, a resolution of the obtained quantum dot light emitting layer is extremely limited. Therefore, the preparation of products of high-resolution quantum dot light emitting display devices is faced with serious problems such as high technical difficulty, low product yield and high product price.

For example, in a process of preparing a full-color quantum dot display panel, in order to avoid an evaporation process and reduce a production cost, a patterned quantum dot light emitting layer is generally prepared by a solution method combined with an ultraviolet exposure process. However, in an actual preparation process, the quantum dot light emitting layer is easy to remain in a film below the quantum dot light emitting layer. For example, the quantum dot light emitting layer is easy to remain in a hole transport layer, a hole injection layer, an electron transport layer or an electron injection layer, etc., which makes the prepared quantum dot light emitting layer of a latter color mix with the prepared quantum dot light emitting layer of the previous color, thus causing a problem of color mixing after the quantum dot light emitting layer is electro-excited.

The inventors of the present disclosure found that before forming a quantum dot light emitting layer of a first color, a sacrificial layer is formed on a film below a preformed quantum dot light emitting layer of the first color, and then photoresist is spin-coated on the sacrificial layer, an exposing process and a developing process are performed on a part of the photoresist corresponding to a quantum dot light emitting layer of the first color that is not necessary to be kept in the later to form a photoresist pattern. Then, the photoresist pattern is used as a mask to protect a part of the sacrificial layer corresponding to the quantum dot light emitting layer of the first color that does not need to be kept, and a part of the sacrificial layer that is not protected by the photoresist pattern is etched to form a sacrificial layer pattern, and for example, an etching method includes an dry etching method. Then a material of the quantum dot light emitting layer of the first color is spin-coated, the sacrificial layer is stripped to remove the sacrificial layer, the photoresist above the sacrificial layer and the material of the quantum dot light emitting layer of the first color on the photoresist, to form a patterned quantum dot light emitting layer of the first color. For example, the introduction of the sacrificial layer avoids the problem that the quantum dot light emitting layer of the first color remains in a film below the quantum dot light emitting layer of the first color, thus avoiding the color mixing problem in the full-color quantum dot display panel.

At least one embodiment of the present disclosure provides a preparation method of a quantum dot light emitting device, the preparation method includes: providing a base substrate; forming a first electrode on the base substrate; forming a first function layer on the first electrode; sequentially forming a first sacrificial layer and a first photoresist layer on the first function layer; patterning the first photoresist layer to form a first photoresist pattern; patterning the first sacrificial layer with the first photoresist pattern as a mask to form a first sacrificial layer pattern, in which the first function layer comprises a first part and a second part, the first sacrificial layer pattern and the first photoresist pattern are sequentially stacked on the first part, and the second part is exposed by the first sacrificial layer pattern and the first photoresist pattern; forming a first quantum dot material layer on the first photoresist pattern and the second part of the first function layer; stripping the first sacrificial layer pattern to remove the first sacrificial layer pattern, and the first photoresist pattern and the first quantum dot material layer that are on the first sacrificial layer pattern, retaining the first quantum dot material layer on the second part of the first function layer to form a first quantum dot light emitting layer; and forming a second electrode on the first quantum dot light emitting layer.

The quantum dot light emitting device formed by the preparation method can avoid the problem that the quantum dot light emitting layer of the first color remains in a film below the quantum dot light emitting layer, thereby avoiding the problem of color mixing in the full-color quantum dot display device.

For example, FIG. 1 is a flowchart of a preparation method of a quantum dot light emitting device provided by an embodiment of the present disclosure. As shown in FIG. 1, the preparation method includes the following steps.

S01: providing a base substrate.
S02: forming a first electrode on the base substrate.
S03: forming a first function layer on the first electrode.
S04: sequentially forming a first sacrificial layer and a first photoresist layer on the first function layer.
S05: patterning the first photoresist layer to form a first photoresist pattern.
S06: patterning the first sacrificial layer with the first photoresist pattern as a mask to form a first sacrificial layer pattern, in which the first function layer comprises a first part and a second part, the first sacrificial layer pattern and the first photoresist pattern are sequentially stacked on the first part, and the second part is exposed by the first sacrificial layer pattern and the first photoresist pattern.
S07: forming a first quantum dot material layer on the first photoresist pattern and the second part of the first function layer.
S08: stripping the first sacrificial layer pattern to remove the first sacrificial layer pattern, and the first photoresist pattern and the first quantum dot material layer that are on the first sacrificial layer pattern, and retaining the first quantum dot material layer on the second part of the first function layer to form a first quantum dot light emitting layer.
S09: forming a second electrode on the first quantum dot light emitting layer.

For example, the quantum dot light emitting device formed by the preparation method shown in FIG. 1 can avoid the problem that the first quantum dot light emitting layer remains in a film below the first function layer, thereby avoiding the problem of color mixing in the full-color quantum dot display device.

For example, FIGS. 2A-2J are process diagrams of the preparation method of the quantum dot light emitting device provided by an embodiment of the present disclosure, and the preparation process of the quantum dot light emitting device is described in detail based on FIGS. 2A-2J.

Figure 2A:
FIGS. 2A-2J are process diagrams of a preparation method of a quantum dot light emitting device provided by an embodiment of the present disclosure.

As shown in FIG. 2A, a base substrate 101 is provided.

For example, the base substrate 101 serves as a support and plays a role of protection, and the base substrate 101 is a glass substrate, a plastic substrate, a quartz substrate or a substrate made of other suitable materials, which is not limited by the embodiments of the present disclosure.

Figure 2B:
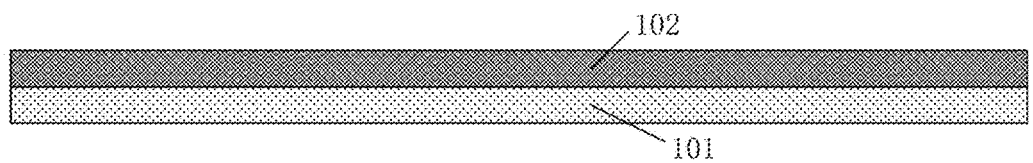

As shown in FIG. 2B, a first electrode 102 is formed on the base substrate 101.

For example, the first electrode 102 is a cathode, and the cathode is made of a transparent conductive oxide such as indium tin oxide (ITO).

Figure 2C:
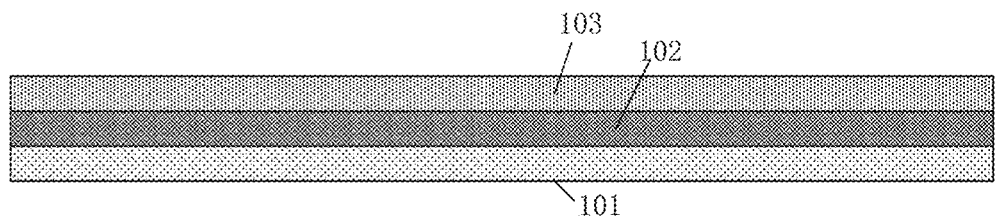

As shown in FIG. 2C, a first function layer 103 is formed on the first electrode 102.

For example, the first function layer 103 is an electron transport layer or an electron injection layer and so on.

For example, in a case that the first function layer 103 is an electron transport layer, a material of the electron transport layer includes an inorganic metal oxide. The inorganic metal oxide includes ZnO, $TiO_2$, $WO_3$ or $SnO_2$, and the like.

For example, in a case that the material of the electron transport layer is zinc oxide (ZnO), the zinc oxide may be zinc oxide nanoparticles directly purchased from the market or a zinc oxide material made by a sol-gel method.

For example, a method of forming the first function layer includes: a spin-coating method or a sol-gel method, and then an annealing treatment is performed at a certain temperature. For example, a temperature of the annealing treatment is 120° C. and a time period of the annealing treatment is 20 minutes. The annealing treatment can remove the solvent, and at the same time, can induce a rearrangement of the thin film of the first function layer, so as to achieve a state most beneficial for carrier transmission.

For example, in a case that the first function layer is the electron transport layer and the material of the electron transport layer is zinc oxide nanoparticles, the process of forming the first function layer by the spin-coating method includes: spin-coating a dense zinc oxide nanoparticle film on the base substrate 101 on which the first electrode 102 is formed, and the material of the zinc oxide nanoparticle film is an ethanol solution of zinc oxide nanoparticles with a concentration in a range of 20 mg/ml to 50 mg/ml. Conditions of the spin-coating are as follows: spin-coating at a rotation speed of 1000 rpm to 2000 rpm for 20 s to 50 s, then annealing at a temperature in a range of 110° C. to 150° C. for 10 minutes to 30 minutes to remove the solvent, and the spin-coating of the first function layer induces a rearrangement of a film of the electron transport layer to achieve the state most beneficial for carrier transmission, so as to form the electron transport layer.

For example, in a case that the first function layer is the electron transport layer and the material of the electron transport layer is the zinc oxide prepared by the sol-gel method, the process of preparing the zinc oxide by the sol-gel method and then forming the electron transport layer includes: preparing solution A with zinc acetate precursor, ethanolamine and 2-methoxyethanol, in which a concentration of zinc acetate is in a range of 150 mg/ml to 165 mg/ml. In the entire solution, a mass percentage of the zinc acetate is in a range of 90% to 95%, and a mass percentage of the ethanolamine is in a range of 2% to 4%. The solution A is spin-coated on the base substrate 101 formed with the first electrode 102 for a time period of 20 s to 50 s at a speed of 2000 rpm to 4000 rpm, and then the spin-coated solution A is annealed at a temperature of 200° C. to 400° C. for a time period of 3 min to 6 min to form the electron transport layer.

Figure 2D:
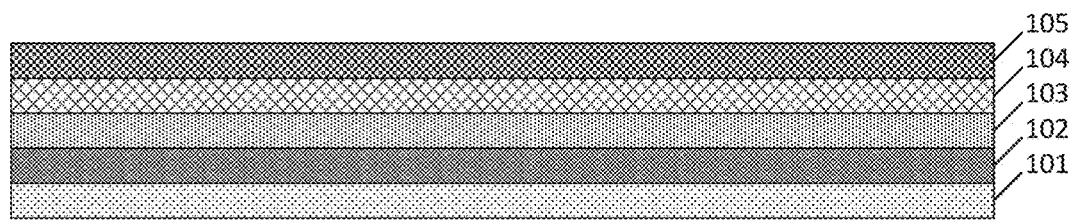

As shown in FIG. 2D, a first sacrificial layer 104 and a first photoresist layer 105 are sequentially formed on the first function layer 103.

For example, a material of the first sacrificial layer 104 and a material of the first photoresist layer 105 cannot be damaged by a material of the first quantum dot layer that needs to be applied later, and stripping liquid used when stripping the first sacrificial layer 104 to remove the first sacrificial layer 104 cannot dissolve quantum dots in the formed first quantum dot layer, and cannot damage the quantum dots. In addition, film formation of the material of the first sacrificial layer 104 can be achieved by a solution method or an evaporation method, and the film formation process cannot damage a material of a film below the first sacrificial layer 104.

For example, the material of the first sacrificial layer 104 includes an alcohol-soluble material, and the alcohol-soluble material includes a polymer material with a relative molecular mass greater than or equal to 1000 or a small molecular material with a relative molecular mass less than 1000.

For example, in a case that the material of the first sacrificial layer 104 is the polymer material with the relative molecular mass greater than or equal to 1000, the polymer material includes at least one selected from a group consisting of polyethylene glycol, polyvinyl alcohol, polyvinylpyrrolidone, polyamide, acrylic polymer, polyfluorene containing a tertiary amine group, polyurethane, alkyd resin, phenolic resin, urea formaldehyde resin and polyvinyl butyral.

For example, in a case that the material of the first sacrificial layer 104 is the small molecular material with the relative molecular mass less than 1000, the small molecular material includes at least one selected from a group consisting of dibromo aminofluorene, dibromo dimethylamino propyl fluorene, bromocarbazole, dialdehyde carbazole, hydroxylcarbazole, amino naphthalimide, dihydroxy phenanthroline, dioctyl tetracarboxy diimide, isopropylphenyl perylene tetraformyl diimide, p-methylbenzoic acid, p-methoxybenzoic acid, p-mercaptobenzoic acid, fullerene benzoic acid and fullerene phosphoric acid.

For example, if the first sacrificial layer 104 is not formed on the first function layer 103, but the first photoresist layer 105 and a first quantum dot layer formed subsequently are directly formed on the first function layer 103, and the first quantum dot layer is patterned by a patterning process, stripping conditions of the first photoresist layer 105 are very intense, and the stripping solution usually adopts alkali solution, and the striping process is performed in a strongly polar aprotic solvent under ultrasonic or a high-temperature boiling condition. Stripping the first photoresist layer 105 under the above conditions causes great damage to the quantum dots in the first quantum dot layer, so forming the first sacrificial layer 104 can prevent damage to the formed first quantum dot layer when stripping the first photoresist layer 105 subsequently.

For example, the first photoresist layer 105 is a negative photoresist. The negative photoresist is not alkaline, and a developing solution used for patterning the negative photoresist is also not alkaline, so that the damage to the first quantum dot layer formed subsequently can be reduced as much as possible. However, a developing solution used for developing a positive photoresist is usually alkaline, therefore the negative photoresist is selected as the material of the first photoresist layer 105 in at least one embodiment of the present disclosure.

For example, the negative photoresist BN-150 is spin-coated at a rotation speed of 3000 rpm to 5000 rpm.

Figure 2E:
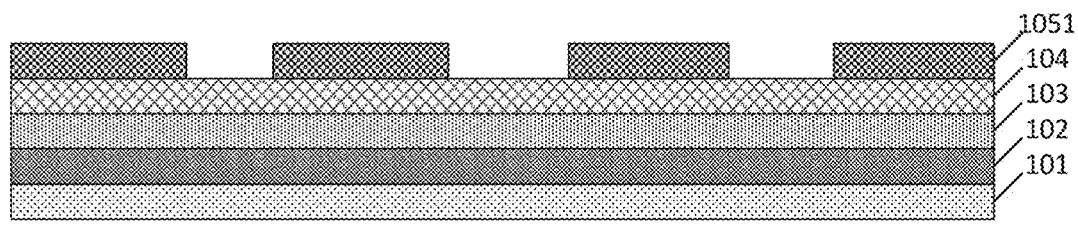

As shown in FIG. 2E, a patterning process is performed on the first photoresist layer 105 to form a first photoresist pattern 1051.

For example, the patterning process performed on the first photoresist layer 105 includes exposing the first photoresist layer 105 with an energy of 30 MJ/cm$^2$ to 60 MJ/cm$^2$, and then developing the exposed photoresist material with par-axylene for 90 seconds to form the first photoresist pattern 1051.

Figure 2F:
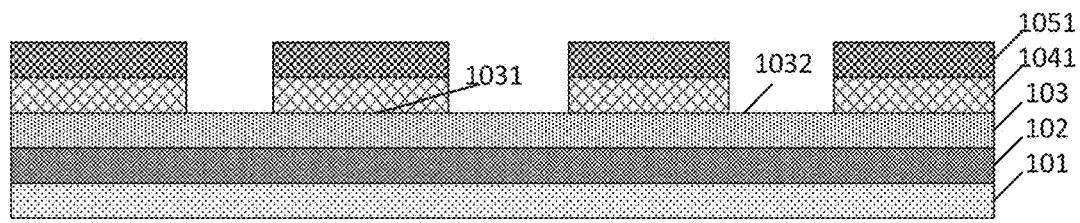

As shown in FIG. 2F, a patterning process is performed on the first sacrificial layer 104 with the first photoresist pattern 1051 as a mask to form a first sacrificial layer pattern 1041, in which the first function layer 103 includes a first part 1031 and a second part 1032, the first sacrificial layer pattern 1041 and the first photoresist pattern 1051 are sequentially stacked on the first part 1031, and the second part 1032 is exposed by the first sacrificial layer pattern 1041 and the first photoresist pattern 1051.

For example, the patterning process is performed on the first sacrificial layer 104 with the first photoresist pattern 1051 as the mask to form the first sacrificial layer pattern 1041, so that a planar shape of the first photoresist pattern 1051 and a planar shape of the first sacrificial layer pattern 1041 are completely the same, and the first photoresist pattern 1051 is stacked on the first sacrificial layer pattern 1041. For example, the patterning process performed on the first sacrificial layer 104 includes using dry etching, such as etching the first sacrificial layer 104 by inductively coupled plasma (ICP) or reactive ion etching (RIE), to etch the first sacrificial layer 104. For example, the etching time is in a range of 10 s to 80 s, such as 10 s, 20 s, 30 s, 40 s, 50 s, 60 s, 70 s or 80 s, and so on. The dry etching can avoid over-etching caused by wet etching.

For example, as required, the process gases used in the ICP dry etching include at least one selected from a group consisting of cl$_2$, Bcl$_3$, HBr, CH$_4$, He, O$_2$, H$_2$ and N$_2$.

It should be noted that, in the embodiment of the present disclosure, a wet etching method may also be adopted.

Figure 2G:
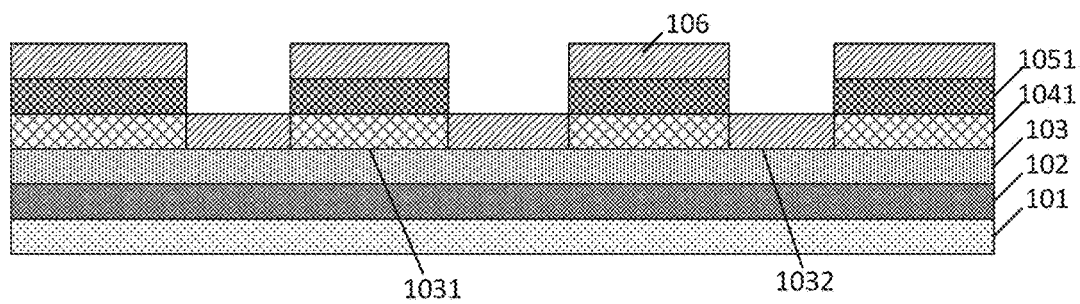

As shown in FIG. 2G, a first quantum dot material layer 106 is formed on the first photoresist pattern 1051 and the second part 1032 of the first function layer 103.

For example, in the structure shown in FIG. 2G, the first quantum dot material layer 106 is integrally formed and covers an entire region corresponding to the first part 1032 and the second part 1032 of the first function layer 103.

For example, the first quantum dot material layer 106 is formed by the spin-coating method, and the quantum dots in the first quantum dot material layer 106 are red quantum dots, green quantum dots or blue quantum dots.

For example, a material of first quantum dots in the first quantum dot material layer 106 includes at least one selected from a group consisting of CdS, CdSe, ZnSe, InP, PbS, CsPbCl$_3$, CsPbBr$_3$, CsPbI$_3$, CdS/ZnS, CdSe/ZnS, ZnSe, InP/ZnS, PbS/ZnS, CsPbCl$_3$/ZnS, CsPbBr$_3$/ZnS and CsPbI$_3$/ZnS.

For example, it is convenient to control the solubility of the quantum dot layer in a mixed solvent by a combination of a good solvent of the quantum dot material and a poor solvent of the quantum dot material.

For example, the step of forming the first quantum dot material layer 106 includes: forming a first quantum dot material: dissolving the first quantum dot material in a solvent to form a first quantum dot material solution, the solvent comprises a good solvent of the first quantum dot material and a poor solvent of the first quantum dot material, and a volume ratio of the good solvent to the poor solvent is in a range of 20:1 to 1:20; and applying the first quantum dot material solution to the first photoresist pattern 1051 and the second part 1032 of the first function layer 103.

For example, the above solvent comprises at least one selected from a group consisting of the following combinations: a combination of n-hexane and acetone, a combination of n-hexane and n-butanol, a combination of n-hexane and isopropanol, a combination of toluene and acetone, a combination of toluene and n-butanol, and a combination of toluene and isopropanol.

For example, a condition of the spin-coating is a rotation speed of 1500 rpm to 3000 rpm, and a time period of the spin-coating is 30 s to 60 s.

Figure 2H:
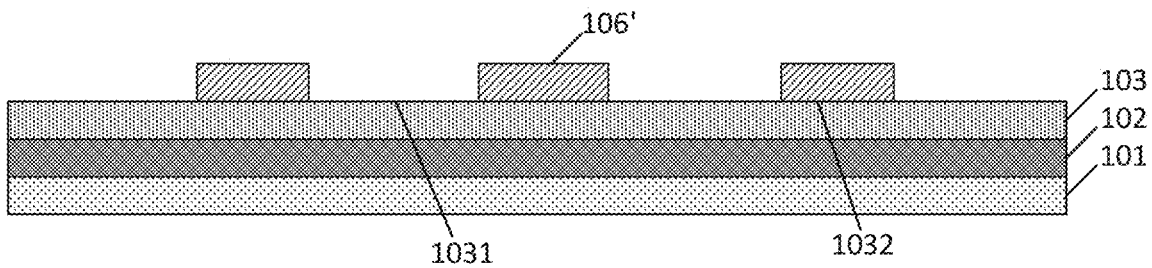

As shown in FIG. 2H, the first sacrificial layer pattern 1041 is stripped to remove the first sacrificial layer pattern 1041, and the first photoresist pattern 1051 and the first quantum dot material layer 106 that are on the first sacrificial layer pattern 1041, and the first quantum dot material layer 106 located on the second part 1032 of the first function layer 103 is retained to form a first quantum dot light emitting layer 106'.

For example, the first sacrificial layer pattern 1041 is stripped by an ultrasonic treatment to remove the first sacrificial layer pattern 1041, and the first photoresist pattern 1051 and the first quantum dot material layer 106 that are on the first sacrificial layer pattern 1041.

For example, the ultrasonic treatment is performed in an alcohol solvent. For example, the alcohol solvent includes at least one selected from a group consisting of ethanol, benzyl alcohol, ethylene glycol and n-amyl alcohol. Among them, a stripping effect is the best in a case that the n-amyl alcohol is used as the ultrasonic solvent, because the n-amyl alcohol has a stronger polarity and cause less damage to the surface of the quantum dots, which is beneficial to maintain the optical properties and electrical properties of the quantum dots.

For example, conditions of the ultrasonic treatment include performing the ultrasonic treatment in ethanol at a power of 30 W to 350 W for 1 min to 8 min. For example, the ethanol can dissolve the first sacrificial layer pattern 1041, and the first sacrificial layer pattern 1041 can be dissolved by using the alcohol solvent during the ultrasonic treatment, so as to remove the first photoresist pattern 1051 and the first quantum dot material layer 106 that are on the first sacrificial layer pattern 1041 at the same time.

For example, after performing the dry etching, a sidewall of the remaining first sacrificial layer pattern 1041 is affected by the dry etching, and is difficult to dissolve in the alcohol solvent. Therefore, the first sacrificial layer pattern 1041 can be stripped better by ultrasonic cleaning in the alcohol solvent after performing the dry etching.

For example, in an example, the first sacrificial layer pattern 1041, and the first photoresist pattern 1051 and the first quantum dot material layer 106 that are located on the first sacrificial layer pattern 1041 may be stripped by the ultrasonic treatment performed in ethanol at a power of 240 W for 4 minutes, and then the first quantum dot material layer is annealed at a temperature of 120° C. for 20 minutes to complete the preparation of the patterned first quantum dot material layer 106.

For example, in order to make the stripping process easier to be carried out, before stripping the first sacrificial layer pattern, the preparation method may further include performing a ligand exchange on the first quantum dots in the first quantum dot material layer 106.

For example, in some embodiments, an original ligand on a surface of the quantum dot includes oleic acid, oleylamine, trioctyl phosphorus or trioctyl oxyphosphorus and so on.

For example, the ligand attached to the surface of the quantum dot(s) may be changed by a ligand exchange method. The ligand exchange includes two methods, the first method is as follows: after preparing quantum dots, dissolving the quantum dots in a suitable solvent, and adding a new ligand for a homogeneous ligand exchange; the second method is as follows: after preparing quantum dots into a thin film in the device, immersing the thin film in a solution dissolved with the new ligand for exchange.

For example, after performing the ligand exchange on the first quantum dot, a total number of an aromatic ring structure or a total number of a cyclic non-aromatic ring structure in the ligand on a surface of the first quantum dot is greater than or equal to 1, a total number of carbon atoms in a main chain of a coordination chain of the ligand except for the aromatic ring structure or the cyclic non-aromatic ring structure is greater than 2 and less than 4, and a coordination atom on the ligand comprises at least one selected from a group consisting of N, O, S and P.

For example, the aromatic ring structure comprises at least one selected from a group consisting of a benzene ring, a nitrogen-containing aromatic ring, a sulfur-containing aromatic ring and an oxygen-containing aromatic ring; the cyclic non-aromatic ring structure comprises at least one selected from a group consisting of an oxygen-containing heterocyclic ring, a nitrogen-containing heterocyclic ring and a sulfur-containing heterocyclic ring.

For example, the aromatic ring structure or the cyclic non-aromatic ring structure includes furan, imidazole, pyridine, quinoline, isoquinoline, pteridine, ethylene oxide, thiirane, aziridinyl, β-propiolactone, β-propiolactam, maleic anhydride, γ-butyrolactone, caprolactam, oxepine, thiepine, 1H-azepine, pyrrole, thiophene, thiazole, oxazole, imidazole, pyrazole, pyrimidine, pyridazine or indole and so on.

For example, a ligand raw material used for the ligand exchange includes p-methylbenzylamine and p-methylphenylethylamine and so on. For example, after the ligand exchange, the first quantum dots in the first quantum dot light emitting layer 106' are more difficult to be dissolved, and performing the ligand exchange on the first quantum dots with p-methylbenzylamine and p-methylphenylethylamine can make the first quantum dot light emitting layer 106' keep a good film morphology.

Figure 2I:
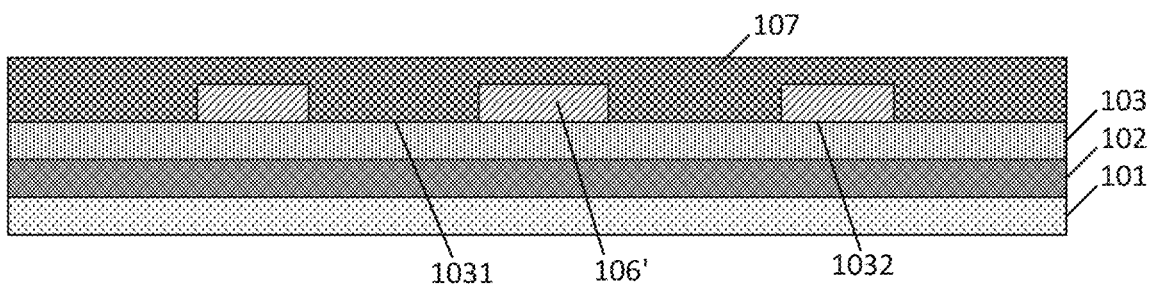

As shown in FIG. 2I, a second function layer 107 is formed on the first quantum dot light emitting layer 106'.

For example, the second function layer 107 is at least one of a hole injection layer and a hole transport layer.

For example, in a case that the second function layer 107 includes both the hole injection layer and the hole transport layer, and the first function layer 103 is an electron transport layer, the hole transport layer is located on a side of the first quantum dot light emitting layer 106' away from the electron transport layer; the hole injection layer is located on a side of the hole transport layer away from the first quantum dot light emitting layer 106'.

A variety of suitable hole transport materials may be used to fabricate the hole transport layer. For example, the material of the hole transport layer includes at least one selected from a group consisting of 4,4'-cyclohexylidene bis[N,N-bis(4-methylphenyl) aniline (TAPC), 4,4',4''-tris(N-carbazolyl) triphenylamine (TCTA) and N,N'-bis(1-naphthyl)-N,N'-diphenylbenzidine (NPB). The hole transport layer may have any suitable thickness.

For example, in an example, the material of the hole transport layer is TCTA, and a thickness of the hole transport layer ranges from about 3 nm to about 25 nm. For example, the thickness of the hole transport layer is about 10 nm.

For example, in another example, the material of the hole transport layer is TAPC, and the thickness of the hole transport layer ranges from about 20 nm to about 100 nm. For example, the thickness of the hole transport layer is about 50 nm.

For example, the hole transport layer may have a double-layer structure, and the hole transport layer includes a sub-layer made of TAPC and a sub-layer made of TCTA, a thickness of the sub-layer made of TAPC ranges from about 30 nm to about 70 nm, for example, about 50 nm; a thickness of the sub-layer made of TCTA ranges from about 6 nm to about 24 nm, for example, about 15 nm.

For example, the hole transport layer includes a sub-layer made of NPB and a sub-layer made of TCTA, and a thicknesses of the sub-layer made of NPB and a thicknesses of the sub-layer made of TCTA may be flexibly set as required, which is not limited herein.

A variety of suitable hole injection materials may be used to fabricate the hole injection layer. For example, a material of the hole injection layer includes at least one selected from a group consisting of $MoO_3$, CuPc and poly (3,4-ethylenedioxythiophene) polystyrene sulfonate (PEDOT:PSS). The hole injection layer can be manufactured to have any suitable thickness.

For example, in an example, the material of the hole injection layer is MoO$_3$, and the thickness of the hole injection layer ranges from about 20 nm to about 80 nm.

Figure 2J:
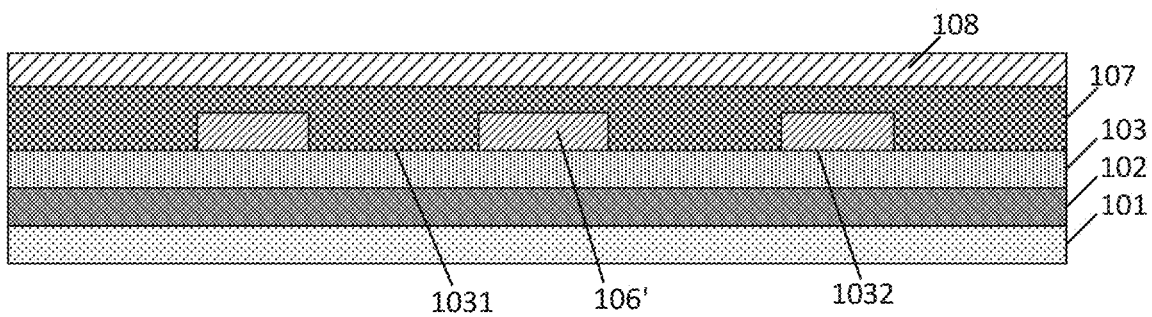

As shown in FIG. 2J, a second electrode 108 is formed on the second function layer 107.

For example, the second electrode 108 is an anode, and various suitable electrode materials may be used to make the second electrode 108. The suitable electrode materials include but are not limited to indium tin oxide, lithium fluoride, aluminum and silver and so on. The second electrode 108 may be manufactured to have any suitable thickness. For example, the second electrode 108 is made of lithium fluoride and has a thickness which ranges from about 0.3 nm to about 2.5 nm, for example, about 1 nm.

For example, the material of the second electrode 108 is metal aluminum or metal silver, and the thickness of the second electrode 108 ranges from about 10 nm to about 250 nm, for example, about 100 nm.

For example, the material of the second electrode 108 is indium tin oxide, and the thickness of the second electrode 108 ranges from about 20 nm to about 180 nm, for example, about 100 nm.

At least one embodiment of the present disclosure further provides a preparation method of a quantum dot display panel, and the preparation method comprises: forming the quantum dot light emitting device by any one of the preparation methods described in the above embodiments.

For example, in an example, before forming the second function layer 107 and the second electrode 108, the preparation method further includes: sequentially forming a second sacrificial layer and a second photoresist layer on the first function layer 103 and the first quantum dot light emitting layer 106'; patterning a second photoresist layer to form a second photoresist pattern; patterning the second sacrificial layer with the second photoresist pattern as a mask to form a second sacrificial layer pattern, in which the first function layer 103 comprises a third part and a fourth part, the second sacrificial layer pattern and the second photoresist pattern are sequentially stacked on the third part, and the fourth part is exposed by the second sacrificial layer pattern and the second photoresist pattern; forming a second quantum dot material layer on the second photoresist pattern and the fourth part of the first function layer; stripping the second sacrificial layer pattern to remove the second sacrificial layer pattern, and the second photoresist pattern and the second quantum dot material layer that are located on the second sacrificial layer pattern, and retaining the second quantum dot material layer on the fourth part of the first function layer to form a second quantum dot light emitting layer.

For example, FIGS. 3A-3E are process diagrams of the preparation method of the second quantum dot light emitting layer in a quantum dot display panel provided by an embodiment of the present disclosure.

Figure 3A:
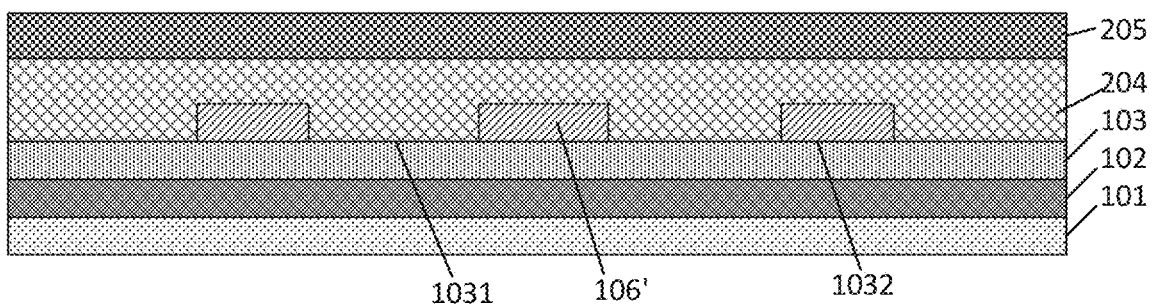
FIGS. 3A-3E are process diagrams of a preparation method of a second quantum dot light emitting layer in a quantum dot display panel provided by an embodiment of the present disclosure.

As shown in FIG. 3A, a second sacrificial layer 204 and a second photoresist layer 205 are sequentially formed on the first function layer 103 and the first quantum dot light emitting layer 106'.

For example, a material of the second sacrificial layer 204 and a material of the second photoresist layer 205 cannot be damaged by a material of the second quantum dot that needs to be applied later, and stripping liquid used during stripping the second sacrificial layer 204 to remove the second sacrificial layer 204 cannot dissolve the quantum dots in the second quantum dot layer, and cannot damage the quantum dots in the second quantum dot layer. In addition, the material of the second sacrificial layer 204 can be formed into a film by a solution method or a vapor deposition method, and the material of a film below the second sacrificial layer 204 cannot be damaged during the film formation process.

For example, the material of the second sacrificial layer 204 includes an alcohol-soluble material including a polymer material with a relative molecular mass greater than or equal to 1000 or a small molecular material with a relative molecular mass less than 1000.

For example, in a case that the material of the second sacrificial layer 204 is the polymer material with the relative molecular mass greater than or equal to 1000, the polymer material includes at least one selected from a group consisting of polyethylene glycol, polyvinyl alcohol, polyvinylpyrrolidone, polyamide, acrylic polymer, polyfluorene containing a tertiary amine group, polyurethane, alkyd resin, phenolic resin, urea formaldehyde resin and polyvinyl butyral.

For example, in a case that the material of the second sacrificial layer 204 is the small molecular material with the relative molecular mass less than 1000, the small molecular material includes at least one selected from a group consisting of dibromo aminofluorene, dibromo dimethylamino propyl fluorene, bromocarbazole, dialdehyde carbazole, hydroxylcarbazole, amino naphthalimide, dihydroxy phenanthroline, dioctyl tetracarboxy diimide, isopropylphenyl perylene tetraformyl diimide, p-methylbenzoic acid, p-methoxybenzoic acid, p-mercaptobenzoic acid, fullerene benzoic acid and fullerene phosphoric acid.

For example, if the second sacrificial layer 204 is not formed on the first function layer 103 and the first quantum dot light emitting layer 106', but the second photoresist layer 205 and a second quantum dot layer formed subsequently are directly formed on the first function layer 103 the first quantum dot light emitting layer 106', and the second quantum dot layer is patterned by a patterning process, stripping conditions of the second photoresist layer 205 are very intense, and the stripping solution usually adopts alkali solution, and the striping process is performed in a strongly polar aprotic solvent under ultrasonic or a high-temperature boiling condition. Stripping the second photoresist layer 205 under the above conditions causes great damage to the quantum dots in the second quantum dot layer, thereby forming the second sacrificial layer 204 can prevent damage to the formed second quantum dot layer when stripping the second photoresist layer 205 subsequently.

For example, the second photoresist layer 205 is a negative photoresist. The negative photoresist is not alkaline, and a developing solution used for patterning the negative photoresist is also not alkaline, so that the damage to the second quantum dot layer formed subsequently can be reduced as much as possible. However, a developing solution used for developing positive photoresist is usually alkaline, therefore the negative photoresist is selected as the material of the second photoresist layer 205 in at least one embodiment of the present disclosure.

For example, the negative photoresist BN-150 is spin-coated at a rotation speed of 3000 rpm to 5000 rpm.

Figure 3B:
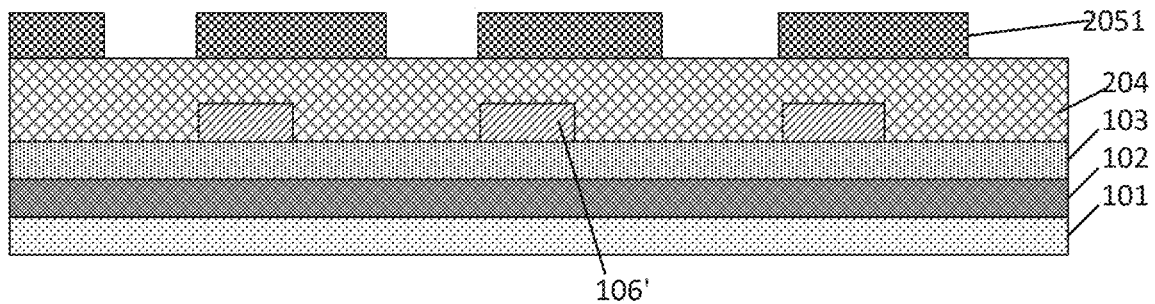

As shown in FIG. 3B, a patterning process is performed on the second photoresist layer 205 to form a second photoresist pattern 2051.

For example, the process of patterning the second photoresist layer 205 can be referred to the above descriptions of patterning the first photoresist layer 105, which are omitted herein.

Figure 3C:
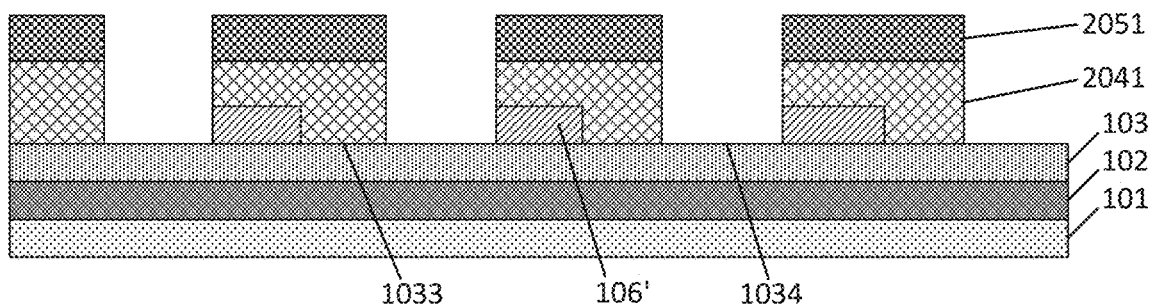

As shown in FIG. 3C, a patterning process is performed on the second sacrificial layer 204 with the second photoresist pattern 2051 as a mask to form a second sacrificial layer pattern 2041, the first function layer 103 includes a third part 1033 and a fourth part 1034, the second sacrificial layer pattern 2041 and the second photoresist pattern 2051 are stacked in sequence on the third part 1033, and the fourth part 1034 is exposed by the second sacrificial layer pattern 2041 and the second photoresist pattern 2041.

For example, a patterning process is performed on the second sacrificial layer 204 with the second photoresist pattern 2051 as a mask to form the second sacrificial layer pattern 2041, so that a planar shape of the second photoresist pattern 2051 and a planar shape of the second sacrificial layer pattern 2041 are completely the same, and the second photoresist pattern 2051 is stacked on the second sacrificial layer pattern 2041.

For example, the second part 1032 of the first function layer 103 partially overlaps with the third part 1033 of the first function layer 103.

Figure 3D:
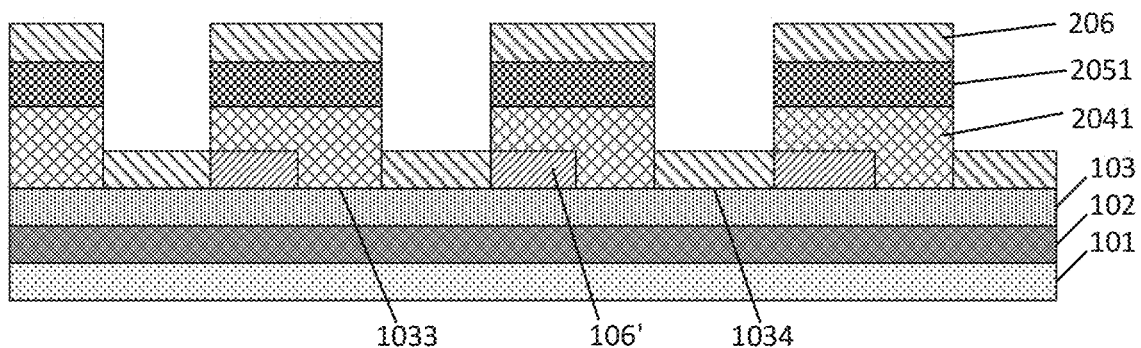

As shown in FIG. 3D, a second quantum dot material layer 206 is formed on the second photoresist pattern 2051 and the fourth part 1034 of the first function layer 103.

For example, the color of light emitted by the first quantum dot light emitting layer 106' formed by the first quantum dot material layer 106 is different from that of the sequentially formed second quantum dot light emitting layer 206' formed by the second quantum dot material layer 206.

Figure 3E:
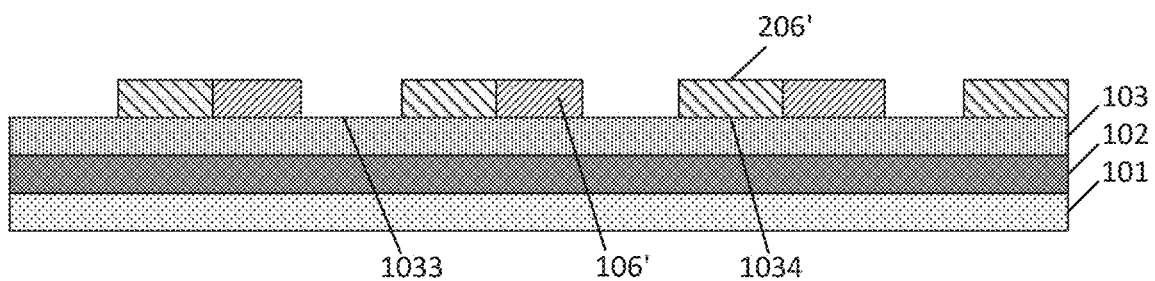

As shown in FIG. 3E, the second sacrificial layer pattern 2041 is stripped to remove the second sacrificial layer pattern 2041, and the second photoresist pattern 2051 and the second quantum dot material layer 206 that are located on the second sacrificial layer pattern 2041, and the second quantum dot material layer 206 on the fourth part 1034 of the first function layer 103 is remained to form the second quantum dot light emitting layer 206'.

For example, the second sacrificial layer pattern 2041 is stripped by an ultrasonic treatment to remove the second sacrificial layer pattern 2041, and the second photoresist pattern 2051 and the second quantum dot material layer 206 that are located on the second sacrificial layer pattern 2041.

For example, the conditions of the ultrasonic treatment, whether to perform the ligand exchange or not, and the types of the ligands before and after the ligand exchange can be referred to the relevant descriptions in the above, which are omitted herein.

For example, in another example, before forming the second function layer 107 and the second electrode 108 and after forming the second quantum dot light emitting layer 206', the preparation method further includes: sequentially forming a third sacrificial layer and a third photoresist layer on the first function layer 103, the first quantum dot light emitting layer 106' and the second quantum dot light emitting layer 206'; patterning the third photoresist layer to form a third photoresist pattern; patterning the third sacrificial layer with the third photoresist pattern as a mask to form a third sacrificial layer pattern, in which the first function layer 103 includes a fifth part and a sixth part, the third sacrificial layer pattern and the third photoresist pattern are sequentially stacked on the fifth part, and the sixth part is exposed by the third sacrificial layer pattern and the third photoresist pattern; forming a third quantum dot material layer on the third photoresist pattern and the sixth part of the first function layer 103; stripping the third sacrificial layer pattern to remove the third sacrificial layer pattern, and the third photoresist pattern and the third quantum dot material layer that are located on the third sacrificial layer pattern, and retaining the third quantum dot material layer on the sixth part of the first function layer 103 to form a third quantum dot light emitting layer.

FIGS. 4A-4E are process diagrams of a preparation method of the third quantum dot light emitting layer in the quantum dot display panel provided by an embodiment of the present disclosure.

Figure 4A:
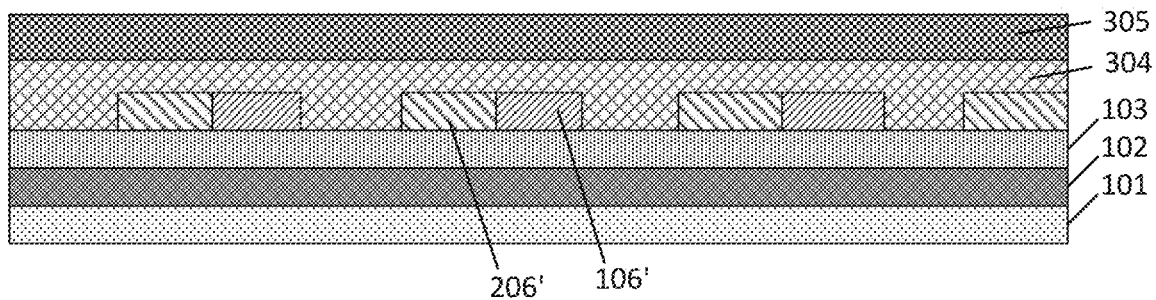
FIGS. 4A-4E are process diagrams of a preparation method of a third quantum dot light emitting layer in a quantum dot display panel provided by an embodiment of the present disclosure.

As shown in FIG. 4A, a third sacrificial layer 304 and a third photoresist layer 305 are sequentially formed on the first function layer 103, the first quantum dot light emitting layer 106' and the second quantum dot light emitting layer 206'.

For example, a material of the third sacrificial layer 304 and a material of the third photoresist layer 305 cannot be damaged by a material of the third quantum dot layer that needs to be applied later, and stripping liquid used when stripping the third sacrificial layer 304 to remove the third sacrificial layer 304 cannot dissolve quantum dots in the formed third quantum dot layer, and cannot damage the quantum dots in the third quantum dot layer. In addition, film formation of the material of the third sacrificial layer 304 can be achieved by a solution method or an evaporation method, and the film formation process cannot damage a material of a film below the third sacrificial layer 304.

For example, the material of the third sacrificial layer 304 includes an alcohol-soluble material, and the alcohol-soluble material includes a polymer material with a relative molecular mass greater than or equal to 1000 or a small molecular material with a relative molecular mass less than 1000.

For example, in a case that the material of the third sacrificial layer 304 is the polymer material with the relative molecular mass greater than or equal to 1000, the polymer material includes at least one selected from a group consisting of polyethylene glycol, polyvinyl alcohol, polyvinylpyrrolidone, polyamide, acrylic polymer, polyfluorene containing a tertiary amine group, polyurethane, alkyd resin, phenolic resin, urea formaldehyde resin and polyvinyl butyral.

For example, in a case that the material of the third sacrificial layer 304 is the small molecular material with the relative molecular mass less than 1000, the small molecular material includes at least one selected from a group consisting of dibromo aminofluorene, dibromo dimethylamino propyl fluorene, bromocarbazole, dialdehyde carbazole, hydroxylcarbazole, amino naphthalimide, dihydroxy phenanthroline, dioctyl tetracarboxy diimide, isopropylphenyl perylene tetraformyl diimide, p-methylbenzoic acid, p-methoxybenzoic acid, p-mercaptobenzoic acid, fullerene benzoic acid and fullerene phosphoric acid.

For example, if the third sacrificial layer 304 is not formed on the first function layer 103, the first quantum dot light emitting layer 106' and the second quantum dot light emitting layer 206', but the third photoresist layer 305 and a third quantum dot layer formed subsequently are directly formed on the first function layer 103, the first quantum dot light emitting layer 106' and the second quantum dot light emitting layer 206', and the third quantum dot layer is patterned by a patterning process, stripping conditions of the third photoresist layer 305 are very intense, and the stripping solution usually adopts alkali solution, and the striping process is performed in a strongly polar aprotic solvent under ultrasonic or a high-temperature boiling condition. Stripping the third photoresist layer 305 under the above conditions causes great damage to the quantum dots in the third quantum dot layer, so forming the third sacrificial layer 304 can prevent damage to the formed first quantum dot layer when stripping the third photoresist layer 305 subsequently.

For example, the third photoresist layer 305 is a negative photoresist. The negative photoresist is not alkaline, and a developing solution used for patterning the negative photoresist is also not alkaline, so that the damage to the third quantum dot layer formed subsequently can be reduced as much as possible. However, a developing solution used for developing positive photoresist is usually alkaline, therefore the negative photoresist is selected as the material of the third photoresist layer 305 in at least one embodiment of the present disclosure.

For example, the negative photoresist BN-150 is spin-coated at a rotation speed of 3000 rpm to 5000 rpm.

Figure 4B:
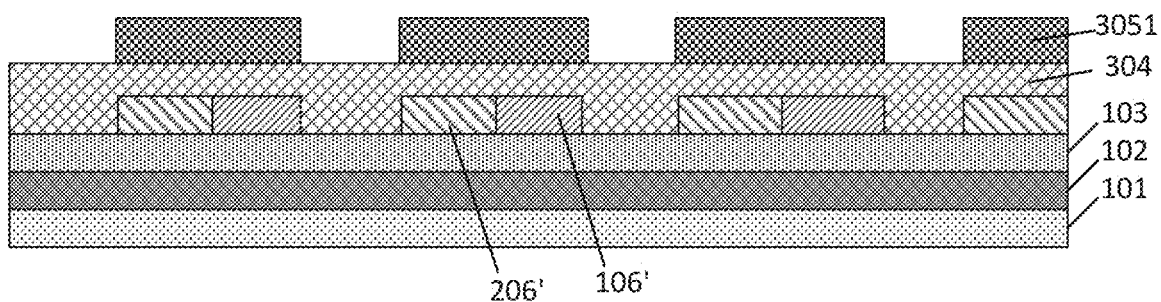

As shown in FIG. 4B, a patterning process is performed on the third photoresist layer 305 to form a third photoresist pattern 3051.

For example, the process of patterning the third photoresist layer 305 can be referred to the above descriptions of patterning the first photoresist layer 105, which are omitted herein.

Figure 4C:
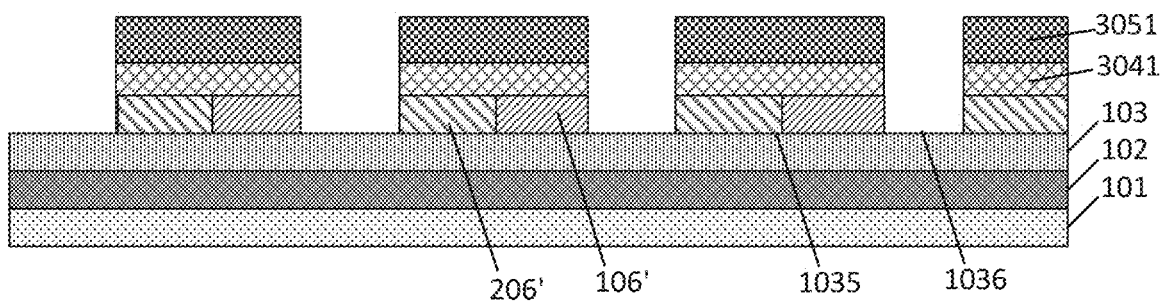

As shown in FIG. 4C, the third sacrificial layer 304 is patterned with the third photoresist pattern 3051 as a mask to form a third sacrificial layer pattern 3041, in which the first function layer 103 includes a fifth part 1035 and a sixth part 1036, the third sacrificial layer pattern 3041 and the third photoresist pattern 3051 are stacked in sequence on the fifth part 1035, and the sixth part 1036 is exposed by the third sacrificial layer pattern 3041 and the third photoresist pattern 3041.

For example, the third sacrificial layer 304 is patterned with the third photoresist pattern 3051 as a mask to form the third sacrificial layer pattern 3041, so that a planar shape of the third photoresist pattern 3051 and a planar shape of the third sacrificial layer pattern 3041 are completely the same, and the third photoresist pattern 3051 is stacked on the third sacrificial layer pattern 3041.

For example, a combination of the second part 1032 of the first function layer 103 and the fourth part 1034 of the first function layer 103 overlaps with the fifth part 1035 of the first function layer 103.

Figure 4D:
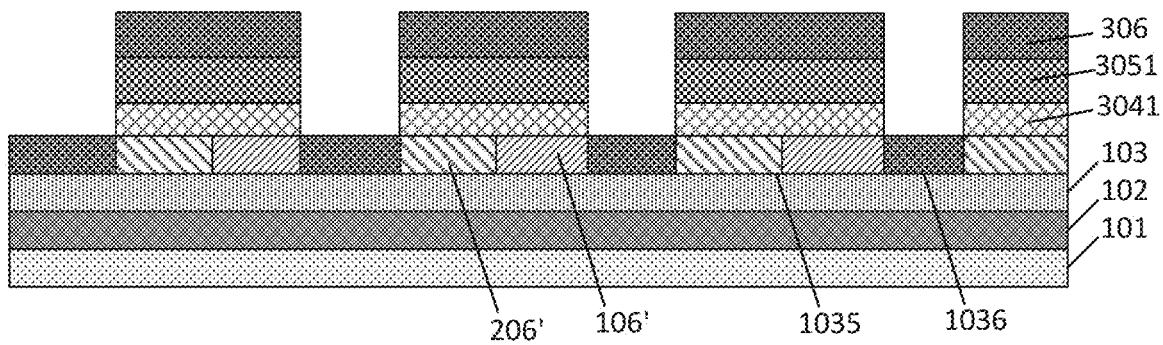

As shown in FIG. 4D, a third quantum dot material layer 306 is formed on the third photoresist pattern 3051 and the sixth part 1036 of the first function layer 103.

For example, the color of light emitted by the first quantum dot light emitting layer 106' formed by the first quantum dot material layer 106, the color of the second quantum dot light emitting layer 206' formed by the second quantum dot material layer 206 and the color of the third quantum dot light emitting layer 306' subsequently formed by the third quantum dot material layer 306 are different from each other.

For example, the first quantum dot emitting layer 106' emits red light, the second quantum dot emitting layer 206' emits green light, and the third quantum dot emitting layer 306' emits blue light. The color of the light emitted by the first quantum dot emitting layer 106', the color of the second quantum dot emitting layer 206', and the color of the third quantum dot emitting layer 306' can be interchanged with each other, which is not limited herein.

Figure 4E:
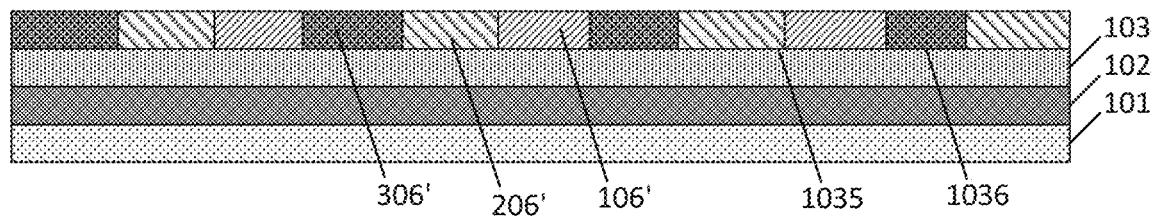

As shown in FIG. 4E, the third sacrificial layer pattern 3041 is stripped to remove the third sacrificial layer pattern 3041, and the third photoresist pattern 3051 and the third quantum dot material layer 306 that are located on the third sacrificial layer pattern 3041, and the third quantum dot material layer 306 on the sixth part 1036 of the first function layer 103 is remained to form a third quantum dot light emitting layer 306'.

For example, the third sacrificial layer pattern 3041 is stripped by an ultrasonic treatment to remove the third sacrificial layer pattern 3041, and the third photoresist pattern 3051 and the third quantum dot material layer 306 that are located on the third sacrificial layer pattern 3041.

For example, conditions of the ultrasonic treatment, whether to perform the ligand exchange or not, and the types of the ligands before and after the ligand exchange can be referred to the relevant descriptions above, which are omitted herein.

For example, the process of preparing a quantum dot display panel is described in detail by the following embodiments.

First Embodiment

No ligand exchange is performed on the quantum dots in the first quantum dot material layer 106, and the material of the quantum dots in the first quantum dot material layer 106 is CdSe/ZnS; the first function layer 103 is the electron transport layer with zinc oxide nanoparticles as the material of the electron transport layer; and the material of the first sacrificial layer 104 is polyvinyl pyrrolidone (PVPK-30).

A compact zinc oxide nanoparticle film is spin-coated on the base substrate 101 provided with the first electrode 102, and a material of the zinc oxide nanoparticle film is an ethanol solution of zinc oxide nanoparticles with a concentration of 30 mg/ml, and conditions of the spin-coating are as follows: spin-coating the material of the zinc oxide nanoparticle film at a rotation speed of 1500 rpm for 40 s, and then annealing the material of the zinc oxide nanoparticle film at 120° C. for 20 minutes to remove the solvent, and the electron transport layer film is induced to rearrange to achieve the state most beneficial for carrier transmission to form the electron transport layer. A PVPK-30 ethanol solution with a concentration of 30 mg/ml is spin-coated on the formed electron transport layer, and conditions of the spin-coating are as follows: spin-coating the PVPK-30 ethanol solution for 45 seconds at a rotation speed of 1500 rpm, and then keeping the spin-coated material in the air for 5 minutes to form the first sacrificial layer 104; and then, a negative photoresist (BN-150) is spin-coated on the formed first sacrificial layer 104 for 45 seconds at a rotation speed of 4000 rpm, and then the spin-coated negative photoresist is exposed at an energy of 50 mJ/cm$^2$, and then the negative photoresist is developed with paraxylene for 90 seconds to complete the preparation of the first photoresist pattern 1051; then, with the first photoresist pattern 1051 as a mask and oxygen as an etching gas, the first sacrificial layer 104 is etched by inductively coupled plasma (ICP) dry etching for 30 seconds to form the first sacrificial layer pattern 1041; then, a red quantum dot material is spin-coated on the first photoresist pattern 1051 and the first function layer 103 as the first quantum dot material layer 106, for example, a condition of spin-coating the red quantum dot material is that spin-coating at a rotation speed of 2500 rpm for 45 seconds; then, the quantum dot light emitting device formed with the first quantum dot material layer 106 is put into ethanol and an ultrasonic treatment is performed at a power of 240 W for 4 min, so that the first sacrificial layer pattern 1041 is dissolved, thereby stripping the first photoresist pattern 1051 on the first sacrificial layer pattern 1041 and the first quantum dot material layer 106 on the first photoresist pattern 1051, and then the quantum dot light emitting device is annealed at 120° C. for 20 minutes to complete the preparation of the first quantum dot light emitting layer 106'.

A PVPK-30 ethanol solution with a concentration of 30 mg/ml is spin-coated on the electron transport layer and the formed first quantum dot light emitting layer 106', conditions of the spin-coating are as follows: spin-coating at a rotation speed of 1500 rpm for 45 seconds, and then keeping the spin-coated material in the air for 5 minutes to form the second sacrificial layer 204; then, a negative photoresist (BN-150) is spin-coated on the formed the second sacrificial layer 204 for 45 seconds at a rotation speed of 4000 rpm, and then the spin-coated negative photoresist is exposed at an energy of 50 mJ/cm$^2$, and then the negative photoresist is developed with paraxylene for 90 seconds to complete the preparation of the second photoresist pattern 2051; then, with the second photoresist pattern 2051 as a mask and oxygen as an etching gas, the second sacrificial layer 204 is etched by inductively coupled plasma (ICP) dry etching for 30 seconds to form the second sacrificial layer pattern 2041; then, a green quantum dot material is spin-coated on the second photoresist pattern 2051 and the first function layer 103 as the second quantum dot material layer 206, for example, a condition of spin-coating the green quantum dot material is that spin-coating at a rotation speed of 2500 rpm for 45 seconds; then, the quantum dot light emitting device provided with the second quantum dot material layer 206 is put into ethanol and an ultrasonic treatment is performed at a power of 240 W for 4 min, so that the second sacrificial layer pattern 2041 is dissolved, thereby stripping the second photoresist pattern 2051 on the second sacrificial layer pattern 2041 and the second quantum dot material layer 206 on the second photoresist pattern 2051, and then the quantum dot light emitting device is annealed at 120° C. for 20 minutes to complete the preparation of the second quantum dot light emitting layer 206'.

A PVPK-30 ethanol solution with a concentration of 30 mg/ml is spin-coated on the electron transport layer, the formed first quantum dot light emitting layer 106' and the formed second quantum dot light emitting layer 206', conditions of the spin-coating are as follows: spin-coating at a rotation speed of 1500 rpm for 45 seconds, and then keeping the spin-coated material in the air for 5 minutes to form the third sacrificial layer 304; then, a negative photoresist (BN-150) is spin-coated on the formed third sacrificial layer 304 for 45 seconds at a rotation speed of 4000 rpm, and then the spin-coated negative photoresist is exposed at an energy of 50 mJ/cm$^2$, and then the negative photoresist is developed with paraxylene for 90 seconds to complete the preparation of the third photoresist pattern 3051; then, with the third photoresist pattern 3051 as a mask and oxygen as an etching gas, the third sacrificial layer 304 is etched by inductively coupled plasma (ICP) dry etching for 30 seconds to form the third sacrificial layer pattern 3041; then, a blue quantum dot material is spin-coated on the third photoresist pattern 3051 and the first function layer 103 as the third quantum dot material layer 306, for example, a condition of spin-coating the blue quantum dot material is that spin-coating at a rotation speed of 2500 rpm for 45 seconds; then, the quantum dot light emitting device formed with the third quantum dot material layer 306 is put into ethanol and an ultrasonic treatment is performed at a power of 240 W for 4 min, so that the third sacrificial layer pattern 3041 is dissolved, thereby stripping the third photoresist pattern 3051 on the third sacrificial layer pattern 3041, and the third quantum dot material layer 306 on the third photoresist pattern 3051, and then the quantum dot light emitting device is annealed at 120° C. for 20 minutes to complete the preparation of the third quantum dot light emitting layer 306'.

After forming the first quantum dot light emitting layer 106', the second quantum dot light emitting layer 206' and the third quantum dot light emitting layer 306', 4,4'-cyclohexylidene bis[N,N-bis(4-methylpheny) aniline (TAPC) and 4,4',4"-tris(N-carbazolyl) triphenylamine (TCTA) are sequentially evaporated to manufacture the hole transport layer, then MoO$_3$ is evaporated to form the hole injection layer, and metallic silver is evaporated to form the second electrode, thus completing the preparation of the full-color quantum dot display panel.

Second Embodiment

The ligand exchange is performed on the quantum dots in the first quantum dot material layer 106, and the material of the quantum dots in the first quantum dot material layer 106 is CdSe/ZnS; the first function layer 103 is an electron transport layer with zinc oxide nanoparticles as the material of the electron transport layer; and the material of the first sacrificial layer 104 is polyvinyl pyrrolidone (PVPK-30).

A compact zinc oxide nanoparticle film is spin-coated on the base substrate 101 provided with the first electrode 102, and a material of the zinc oxide nanoparticle film is an ethanol solution of zinc oxide nanoparticles with a concentration of 30 mg/ml, and conditions of the spin-coating are as follows: spin-coating the material of the zinc oxide nanoparticle film at a rotation speed of 1500 rpm for 40 s, and then annealing the material of the zinc oxide nanoparticle film at 120° C. for 20 minutes to remove the solvent, and the electron transport layer film is induced to rearrange to achieve the state most beneficial for carrier transmission to form the electron transport layer. A PVPK-30 ethanol solution with a concentration of 30 mg/ml is spin-coated on the formed electron transport layer, and conditions of the spin-coating are as follows: spin-coating the PVPK-30 ethanol solution for 45 seconds at a rotation speed of 1500 rpm, and then keeping the spin-coated material in the air for 5 minutes to form the first sacrificial layer 104; and then, a negative photoresist (BN-150) is spin-coated on the formed first sacrificial layer 104 for 45 seconds at a rotation speed of 4000 rpm, and then the spin-coated negative photoresist is exposed at an energy of 50 mJ/cm$^2$, and then the negative photoresist is developed with paraxylene for 90 seconds to complete the preparation of the first photoresist pattern 1051; then, with the first photoresist pattern 1051 as a mask and oxygen as an etching gas, the first sacrificial layer 104 is etched by inductively coupled plasma (ICP) dry etching for 30 seconds to form the first sacrificial layer pattern 1041; then, a red quantum dot material is spin-coated on the first photoresist pattern 1051 and the first function layer 103 as the first quantum dot material layer 106, for example, a condition of spin-coating the red quantum dot material is that spin-coating at a rotation speed of 2500 rpm for 45 seconds; an ethanol solution of p-methylbenzylamine with a concentration of 10 mg/ml is used for performing the ligand exchange on the first quantum dot material layer 106 after the completion of spin-coating the red quantum dot material, a time period of the ligand exchange is 30 s, and excess ligand solution is removed by spin-coating after the ligand exchange; the ligand exchange makes the red quantum dots more difficult to be dissolved, and the quantum dot ligand after the ligand exchange is mainly p-methylbenzylamine; then, the quantum dot light emitting device provided with the first quantum dot material layer 106 is put into ethanol and an ultrasonic treatment is performed at a power of 240 W for 4 min, so that the first sacrificial layer pattern 1041 is dissolved, thereby stripping the first photoresist pattern 1051 on the first sacrificial layer pattern 1041 and the first quantum dot material layer 106 on the first photoresist pattern 1051, and then the quantum dot light emitting device is annealed at 120° C. for 20 minutes to complete the preparation of the first quantum dot light emitting layer 106'.

A PVPK-30 ethanol solution with a concentration of 30 mg/ml is spin-coated on the electron transport layer and the formed first quantum dot light emitting layer 106', conditions of the spin-coating are as follows: spin-coating at a rotation speed of 1500 rpm for 45 seconds, and then keeping the spin-coated material in the air for 5 minutes to form the second sacrificial layer 204; then, a negative photoresist (BN-150) is spin-coated on the formed the second sacrificial layer 204 for 45 seconds at a rotation speed of 4000 rpm, and then the spin-coated negative photoresist is exposed at an energy of 50 mJ/cm$^2$, and then the negative photoresist is developed with paraxylene for 90 seconds to complete the preparation of the second photoresist pattern 2051; then, with the second photoresist pattern 2051 as a mask and oxygen as an etching gas, the second sacrificial layer 204 is etched by inductively coupled plasma (ICP) dry etching for 30 seconds to form the second sacrificial layer pattern 2041; then, a green quantum dot material is spin-coated on the second photoresist pattern 2051 and the first function layer 103 as the second quantum dot material layer 206, for example, a condition of spin-coating the green quantum dot material is that spin-coating at a rotation speed of 2500 rpm for 45 seconds; an ethanol solution of p-methylbenzylamine with a concentration of 10 mg/ml is used for performing the ligand exchange on the second quantum dot material layer 206 after the completion of spin-coating the green quantum dot material, a time period of the ligand exchange is 30 s, and excess ligand solution is removed by spin-coating after the ligand exchange; the ligand exchange makes the red quantum dots more difficult to be dissolved, and the quantum dot ligand after the ligand exchange is mainly p-methylbenzylamine; then, the quantum dot light emitting device formed with the second quantum dot material layer 206 is put into ethanol and an ultrasonic treatment is performed at a power of 240 W for 4 min, so that the second sacrificial layer pattern 2041 is dissolved, thereby stripping the second photoresist pattern 2051 on the second sacrificial layer pattern 2041 and the second quantum dot material layer 206 on the second photoresist pattern 2051, and then the quantum dot light emitting device is annealed at 120° C. for 20 minutes to complete the preparation of the second quantum dot light emitting layer 206'.

A PVPK-30 ethanol solution with a concentration of 30 mg/ml is spin-coated on the electron transport layer, the formed first quantum dot light emitting layer 106' and the formed second quantum dot light emitting layer 206', conditions of the spin-coating are as follows: spin-coating at a rotation speed of 1500 rpm for 45 seconds, and then keeping the spin-coated material in the air for 5 minutes to form the third sacrificial layer 304; then, a negative photoresist (BN-150) is spin-coated on the formed the third sacrificial layer 304 for 45 seconds at a rotation speed of 4000 rpm, and then the spin-coated negative photoresist is exposed at an energy of 50 mJ/cm$^2$, and then the negative photoresist is developed with paraxylene for 90 seconds to complete the preparation of the third photoresist pattern 3051; then, with the third photoresist pattern 3051 as a mask and oxygen as an etching gas, the third sacrificial layer 304 is etched by inductively coupled plasma (ICP) dry etching for 30 seconds to form the third sacrificial layer pattern 3041; then, a blue quantum dot material is spin-coated on the third photoresist pattern 3051 and the first function layer 103 as the third quantum dot material layer 306, for example, a condition of spin-coating the blue quantum dot material is that spin-coating at a rotation speed of 2500 rpm for 45 seconds; then, the quantum dot light emitting device formed with the third quantum dot material layer 306 is put into ethanol and an ultrasonic treatment is performed at a power of 240 W for 4 min, so that the third sacrificial layer pattern 3041 is dissolved, thereby stripping the third photoresist pattern 3051 on the third sacrificial layer pattern 3041, and the third quantum dot material layer 306 on the third photoresist pattern 3051, and then the quantum dot light emitting device is annealed at 120° C. for 20 minutes to complete the preparation of the third quantum dot light emitting layer 306'.

After forming the first quantum dot light emitting layer 106', the second quantum dot light emitting layer 206' and the third quantum dot light emitting layer 306', 4,4'-cyclohexylidene bis[N,N-bis(4-methylpheny) aniline (TAPC) and 4,4',4''-tris(N-carbazolyl) triphenylamine (TCTA) are sequentially evaporated to manufacture the hole transport layer, then MoO$_3$ is evaporated to form the hole injection layer, and metallic silver is evaporated to form the second electrode, thus completing the preparation of the full-color quantum dot display panel.

Third Embodiment

No ligand exchange is performed on the quantum dots in the first quantum dot material layer 106, and the material of the quantum dots in the first quantum dot material layer 106 is CdSe/ZnS; the first function layer 103 is the electron transport layer with zinc oxide made by a sol-gel method as the material of the electron transport layer; and the material of the first sacrificial layer 104 is polyvinyl pyrrolidone (PVPK-30).

The differences between the preparation method in the third embodiment and the preparation method in the first embodiment are as follows: the material of the electron transport layer is the zinc oxide prepared by a sol-gel method instead of the purchased zinc oxide nanoparticles; and when forming the first sacrificial layer 104, the concentration of the used PVPK-30 ethanol solution is different.

The process of preparing the zinc oxide by the sol-gel method and then forming the electron transport layer includes: preparing solution A with zinc acetate precursor, ethanolamine and 2-methoxyethanol, in which a concentration of the zinc acetate is 157 mg/ml; in the entire solution, a mass percentage of the zinc acetate is 93%, and a mass percentage of the ethanolamine is 4%. The solution A is spin-coated on the base substrate 101 provided with the first electrode 102 for a time period of 40 s at a speed of 3000 rpm, and then the spin-coated solution A is annealed at a temperature of 300° C. for a time period of 5 min to form the electron transport layer.

The process of forming the first sacrificial layer 104 includes: spin-coating PVPK-30 ethanol solution with a concentration of 10 mg/ml on the formed electron transport layer, and conditions of the spin-coating are as follows: spin-coating the PVPK-30 ethanol solution for 45 seconds at a rotation speed of 1500 rpm, and then keeping the spin-coated material in the air for 5 minutes to form the first sacrificial layer 104.

The process of preparing other films of the full-color quantum dot display panel can be referred to the related descriptions in the first embodiment, which are omitted herein.

Figure 5:
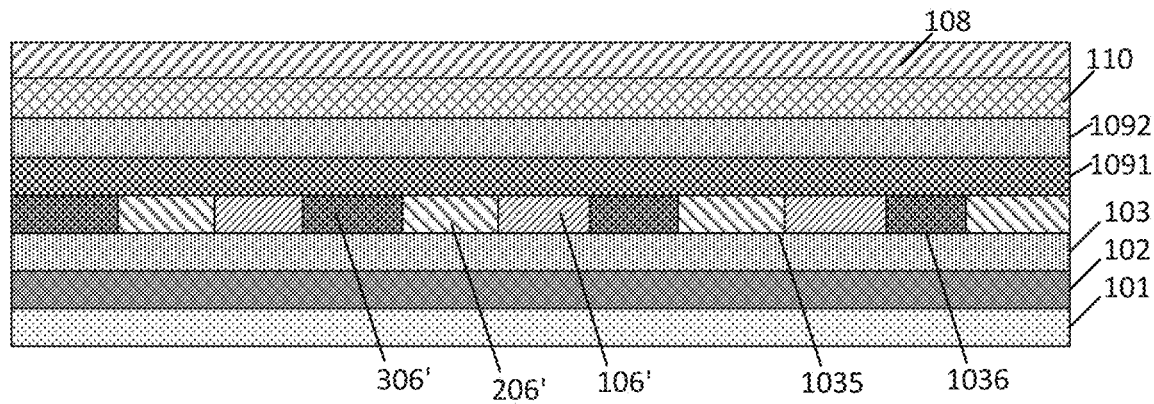
FIG. 5 is a schematic cross-sectional structure diagram of a quantum dot display panel provided by an embodiment of the present disclosure.
Figure 6:
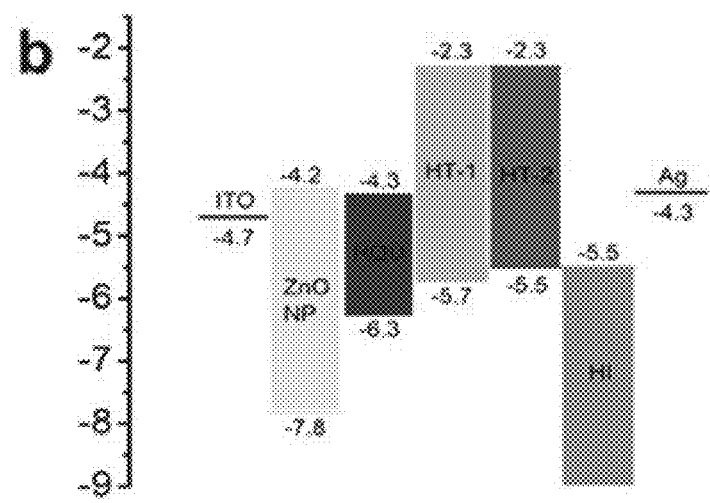
FIG. 6 is an energy level diagram corresponding to the quantum dot display panel in FIG. 5.

For example, FIG. 5 is a schematic cross-sectional structure diagram of a quantum dot display panel provided by an embodiment of the present disclosure. As shown in FIG. 5, the quantum dot light emitting display panel includes a base substrate 101, a first electrode 102 provided on the base substrate 101, an electron transport layer 103 provided on the first electrode 102, and a light emitting layer provided on the electron transport layer 103. The light emitting layer includes a first quantum dot light emitting layer 106', a second quantum dot light emitting layer 206' and a third quantum dot light emitting layer 306' that are provided in a same layer, a first hole transport layer 1091 and a second hole transport layer 1092 that are provided on the light emitting layer, a hole injection layer 110 provided on the first hole transport layer 1091 and second hole transport layer 1092, and a second electrode 108 provided on the hole injection layer 110. Detailed descriptions of the above-mentioned layers can be referred to the relevant descriptions mentioned above, which are omitted herein. For example, FIG. 6 is an energy level diagram corresponding to the quantum dot display panel in FIG. 5, and the electron transport layer in the structure shown in FIG. 5 is formed by the method in the first embodiment.

At least one embodiment of the present disclosure further provides a quantum dot light emitting device, and the quantum dot light emitting device includes a quantum dot light emitting layer, the quantum dots included in the quantum dot light emitting layer are provided with a ligand formed of at least one selected from a group consisting of p-methylbenzylamine and p-methylphenylethylamine.

For example, the ligand exchange is performed on the quantum dots to make surfaces of the quantum dots formed after the ligand exchange include a ligand formed of p-methylbenzylamine or p-methylphenylethylamine, and then the quantum dots in the quantum dot light emitting layer formed after the ligand exchange become more difficult to be dissolved, so that the quantum dot light emitting layer can maintain a good film morphology.

It should be noted that, for those skilled in the art, other essential structures that the quantum dot light emitting device should have can be referred to the conventional design, which are omitted herein.

Figure 7:
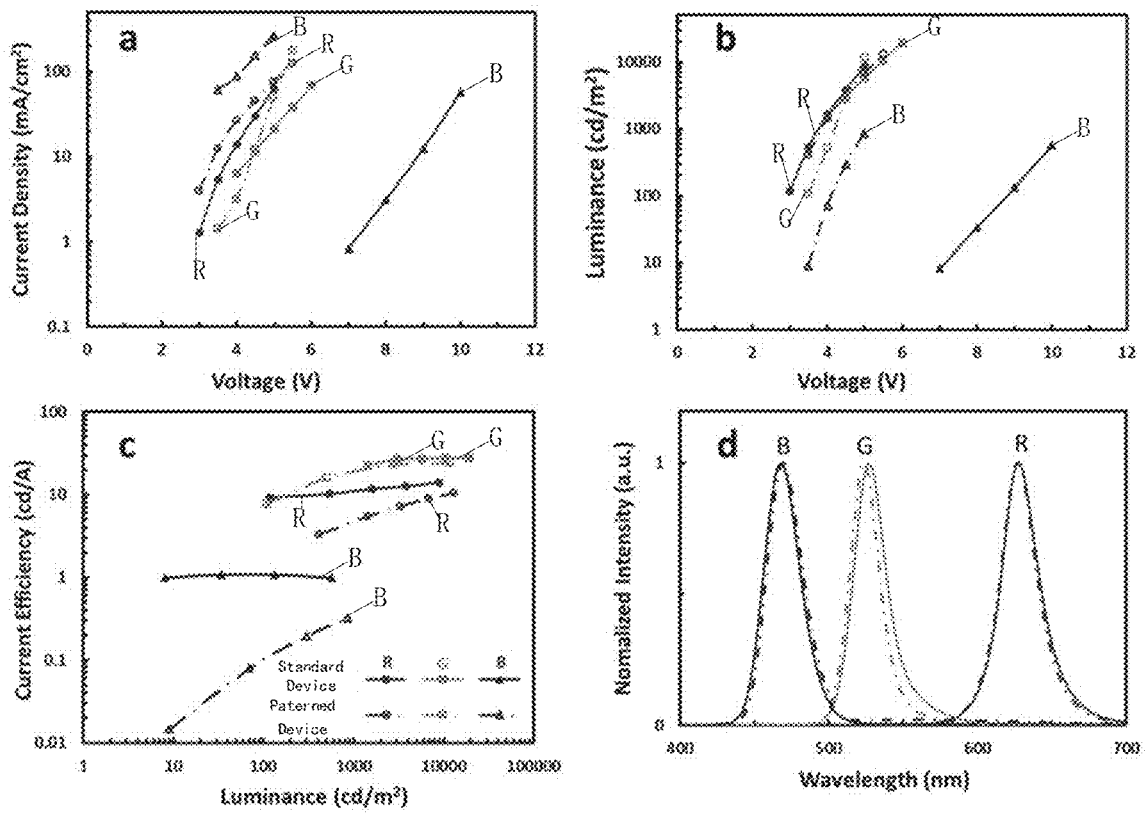
FIG. 7 is a comparison diagram of a quantum dot light emitting device provided by an embodiment of the present disclosure and a standard quantum dot light emitting device.

For example, FIG. 7 is a comparison diagram of a quantum dot light emitting device provided by an embodiment of the present disclosure and a standard quantum dot light emitting device.

For example, in the standard quantum dot light emitting device, a quantum dot light emitting layer is formed without patterning the quantum dot material layer after forming the quantum dot material layer by spin-coating.

In FIG. 7, the quantum dot light emitting device formed by the preparation method in the first embodiment is illustrated as an example.

It can be seen from FIG. 7(a) that a current density varies with a voltage. Compared with the standard quantum dot light emitting device, the current density of a patterned red quantum dot light emitting device and the current density of a patterned green quantum dot light emitting device have little change with the voltage, while the current density of a patterned blue quantum dot light emitting device has some changes with the voltage.

It can be seen from FIG. 7(b) that compared with the standard quantum dot light emitting device, a starting voltage of the patterned blue quantum dot light emitting device is reduced, and a starting voltage of the patterned red quantum dot light emitting device and a starting voltage of the patterned green quantum dot light emitting device are basically unchanged.

It can be seen from FIG. 7(c) that compared with the standard quantum dot light emitting device, the light emitting current efficiency of the patterned red quantum dot light emitting device and the light emitting current efficiency of the patterned green quantum dot light emitting device are basically unchanged, while the light emitting current efficiency of the patterned blue quantum dot light emitting device is reduced.

It can be seen from FIG. 7(d) that an emission spectra of the standard quantum dot light emitting device and an emission spectra of the patterned quantum dot light emitting device are basically the same.

Figure 8:
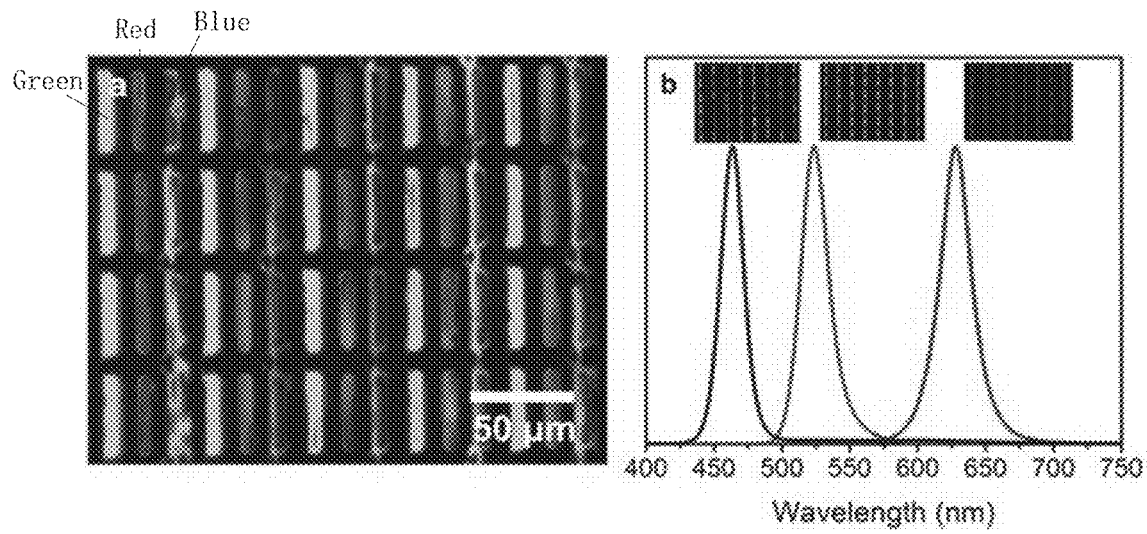
FIG. 8 is a photo of a full-color electroluminescent device and an emission spectrum of the full-color electroluminescent device.

FIG. 8 is a photo of a full-color electroluminescent device and an emission spectrum of the full-color electroluminescent device.

Figure 9:
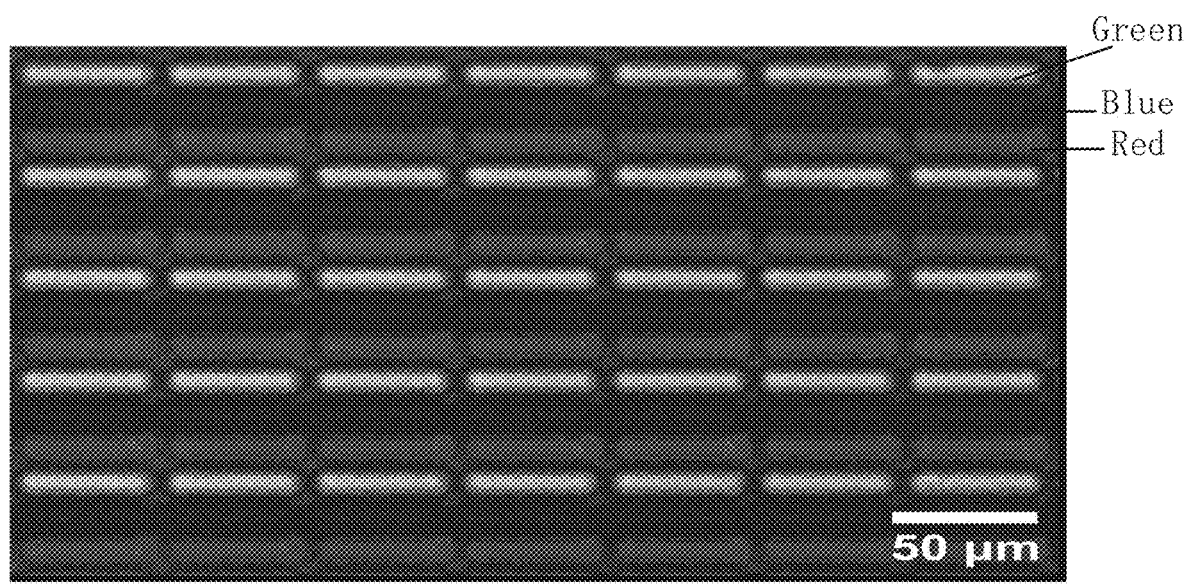
FIG. 9 is a photo of a full-color photoluminescence device.

FIG. 9 is a photo of a full-color photoluminescence device.

It can be seen from FIG. 8 and FIG. 9 that in the case that the quantum dot light emitting layer formed by patterning the quantum dot material layer is used in the quantum dot light emitting device, the quantum dot light emitting layer does not affect normal display of the quantum dot light emitting device.

The quantum dot light emitting device and the preparation method thereof, and the preparation method of the quantum dot display panel provided by the embodiments of the present disclosure have the following beneficial effects: the problem that a quantum dot light emitting layer of a first color remains in a film below the quantum dot light emitting layer can be avoided, and the problem of color mixing in a full-color quantum dot display panel can be further avoided.

The following statements should be noted.
(1) The accompanying drawings involve only the structure(s) in connection with the embodiment(s) of the present disclosure, and other structure(s) can be referred to common design(s).
(2) For the purpose of clarity, in accompanying drawings for illustrating the embodiment(s) of the present disclosure, the thickness of a layer or a region may be enlarged or narrowed, that is, the drawings are not drawn in a real scale. It is understood that, when an element such as a layer, a film, a part or a substrate is referred to as being "above" or "below" another element, the element may be "directly" "above" or "below" another element, or there may be an intermediate element.
(3) In case of no conflict, features in one embodiment or in different embodiments can be combined to obtain new embodiments.

What have been described above are only specific implementations of the present disclosure, the protection scope of the present disclosure is not limited thereto, and the protection scope of the present disclosure should be based on the protection scope of the claims.

What is claimed is:
1. A preparation method of a quantum dot light emitting device, comprising:
providing a base substrate;
forming a first electrode on the base substrate;
forming a first function layer on the first electrode;
sequentially forming a first sacrificial layer and a first photoresist layer on the first function layer;

patterning the first photoresist layer to form a first photoresist pattern;

patterning the first sacrificial layer with the first photoresist pattern as a mask to form a first sacrificial layer pattern, wherein the first function layer comprises a first part and a second part, wherein the first sacrificial layer pattern and the first photoresist pattern are sequentially stacked on the first part, and the second part is exposed by the first sacrificial layer pattern and the first photoresist pattern;

forming a first quantum dot material layer on the first photoresist pattern and the second part of the first function layer;

stripping the first sacrificial layer pattern to remove the first sacrificial layer pattern, and the first photoresist pattern and the first quantum dot material layer that are on the first sacrificial layer pattern, and retaining the first quantum dot material layer on the second part of the first function layer to form a first quantum dot light emitting layer; and forming a second electrode on the first quantum dot light emitting layer.

2. The preparation method according to claim 1, wherein a material of the first sacrificial layer comprises an alcohol-soluble material.

3. The preparation method according to claim 2, wherein the alcohol-soluble material comprises at least one selected from a group consisting of polyethylene glycol, polyvinyl alcohol, polyvinylpyrrolidone, polyamide, acrylic polymer, polyfluorene containing a tertiary amine group, polyurethane, alkyd resin, phenolic resin, urea formaldehyde resin, polyvinyl butyral, dibromo aminofluorene, dibromo dimethylamino propyl fluorene, bromocarbazole, dialdehyde carbazole, hydroxylcarbazole, amino naphthalimide, dihydroxy phenanthroline, dioctyl tetracarboxy diimide, isopropylphenyl perylene tetraformyl diimide, p-methylbenzoic acid, p-methoxybenzoic acid, p-mercaptobenzoic acid, fullerene benzoic acid, and fullerene phosphoric acid.

4. The preparation method according to claim 2, wherein the patterning the first sacrificial layer comprises etching the first sacrificial layer by dry etching.

5. The preparation method according to claim 2, wherein the first sacrificial layer pattern is stripped by ultrasonic treatment to remove the first sacrificial layer pattern, and the first photoresist pattern and the first quantum dot material layer that are on the first sacrificial layer pattern.

6. The preparation method according to claim 1, wherein the patterning the first sacrificial layer comprises etching the first sacrificial layer by dry etching.

7. The preparation method according to claim 1, wherein the first photoresist layer is a negative photoresist.

8. The preparation method according to claim 1, wherein the first sacrificial layer pattern is stripped by ultrasonic treatment to remove the first sacrificial layer pattern, and the first photoresist pattern and the first quantum dot material layer that are on the first sacrificial layer pattern.

9. The preparation method according to claim 8, wherein the ultrasonic treatment is performed in an alcohol solvent.

10. The preparation method according to claim 9, wherein conditions of the ultrasonic treatment comprise an ultrasonic treatment in ethanol at a power in a range of 30 W to 350 W for 1 minute to 8 minutes.

11. The preparation method according to claim 1, wherein before stripping the first sacrificial layer pattern, the method further comprises: performing a ligand exchange on a first quantum dot in the first quantum dot material layer.

12. The preparation method according to claim 11, wherein after performing the ligand exchange on the first quantum dot, a total number of an aromatic ring structure or a total number of a cyclic non-aromatic ring structure in a ligand on a surface of the first quantum dot is greater than or equal to 1, a total number of carbon atoms in a main chain of a coordination chain of the ligand except for the aromatic ring structure or the cyclic non-aromatic ring structure is greater than 2 and less than 4, and a coordination atom on the ligand comprises at least one selected from a group consisting of N, O, S, and P.

13. The preparation method according to claim 12, wherein the aromatic ring structure comprises at least one selected from a group consisting of a benzene ring, a nitrogen-containing aromatic ring, a sulfur-containing aromatic ring, and an oxygen-containing aromatic ring; and wherein the cyclic non-aromatic ring structure comprises at least one selected from a group consisting of an oxygen-containing heterocyclic ring, a nitrogen-containing heterocyclic ring, and a sulfur-containing heterocyclic ring.

14. The preparation method according to claim 11, wherein the performing a ligand exchange includes a ligand, and the ligand used for the ligand exchange comprises at least one selected from a group consisting of p-methylbenzylamine and p-methylphenylethylamine.

15. The preparation method according to claim 1, wherein a first quantum dot material in the first quantum dot material layer comprises at least one selected from a group consisting of CdS, CdSe, ZnSe, InP, PbS, $CsPbCl_3$, $CsPbBr_3$, $CsPbI_3$, CdS/ZnS, CdSe/ZnS, ZnSe, InP/ZnS, PbS/ZnS, $CsPbCl_3$/ZnS, $CsPbBr_3$/ZnS, and $CsPbI_3$/ZnS.

16. The preparation method according to claim 1, wherein a method for forming the first function layer comprises a spin-coating method or a sol-gel method.

17. A preparation method of a quantum dot display panel, comprising: forming the quantum dot light emitting device using the preparation method according to claim 1.

18. The preparation method according to claim 17, wherein before forming the second electrode, the preparation method further comprises:

sequentially forming a second sacrificial layer and a second photoresist layer on the first function layer and the first quantum dot light emitting layer;

patterning the second photoresist layer to form a second photoresist pattern;

patterning the second sacrificial layer with the second photoresist pattern as a mask to form a second sacrificial layer pattern, wherein the first function layer comprises a third part and a fourth part, the second sacrificial layer pattern and the second photoresist pattern are sequentially stacked on the third part, and the fourth part is exposed by the second sacrificial layer pattern and the second photoresist pattern;

forming a second quantum dot material layer on the second photoresist pattern and the fourth part of the first function layer; and stripping the second sacrificial layer pattern to remove the second sacrificial layer pattern, and the second photoresist pattern and the second quantum dot material layer that are on the second sacrificial layer pattern, and retaining the second quantum dot material layer on the fourth part of the first function layer to form a second quantum dot light emitting layer.

19. The preparation method according to claim 18, further comprising:

sequentially forming a third sacrificial layer and a third photoresist layer on the first function layer, the first quantum dot light emitting layer and the second quantum dot light emitting layer;

patterning the third photoresist layer to form a third photoresist pattern;

patterning the third sacrificial layer with the third photoresist pattern as a mask to form a third sacrificial layer pattern, wherein the first function layer comprises a fifth part and a sixth part, the third sacrificial layer pattern and the third photoresist pattern are sequentially stacked on the fifth part, and the sixth part is exposed by the third sacrificial layer pattern and the third photoresist pattern;

forming a third quantum dot material layer on the third photoresist pattern and the sixth part of the first function layer; and stripping the third sacrificial layer pattern to remove the third sacrificial layer pattern, and the third photoresist pattern and the third quantum dot material layer that are on the third sacrificial layer pattern, and retaining the third quantum dot material layer on the sixth part of the first function layer to form a third quantum dot light emitting layer.

\* \* \* \* \*